United States Patent
Okumura

(10) Patent No.: US 6,787,384 B2
(45) Date of Patent: Sep. 7, 2004

(54) FUNCTIONAL DEVICE, METHOD OF MANUFACTURING THEREFOR AND DRIVER CIRCUIT

(75) Inventor: Toshiyuki Okumura, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/653,810

(22) Filed: Sep. 3, 2003

(65) Prior Publication Data

US 2004/0042287 A1 Mar. 4, 2004

Related U.S. Application Data

(62) Division of application No. 10/215,912, filed on Aug. 9, 2002.

(30) Foreign Application Priority Data

Aug. 17, 2001 (JP) .......................................... 2001/248420

(51) Int. Cl.[7] ............................................. H01L 21/00
(52) U.S. Cl. ......................... 438/53; 438/106; 438/110
(58) Field of Search ............................. 438/53, 54, 61, 438/65, 103, 106, 110

(56) References Cited

U.S. PATENT DOCUMENTS

| | | | |
|---|---|---|---|
| 5,552,924 A | * 9/1996 | Tregilgas | ..................... 359/224 |
| 5,963,788 A | 10/1999 | Barron et al. | ................... 438/48 |
| 6,140,144 A | * 10/2000 | Najafi et al. | ................... 438/53 |
| 6,396,711 B1 | * 5/2002 | Degani et al. | .............. 361/760 |
| 6,433,463 B1 | * 8/2002 | Lal et al. | ..................... 310/328 |

FOREIGN PATENT DOCUMENTS

| | | | | |
|---|---|---|---|---|
| JP | 11-144596 | 5/1999 | .......... | H01L/59/00 |
| JP | 11-330254 | 11/1999 | .......... | H01L/21/82 |
| JP | 2000-314846 | 11/2000 | .......... | G02B/26/10 |
| JP | 2001-117025 | 4/2001 | .......... | G02B/26/08 |
| JP | 2002-036200 | 2/2002 | ............. | B81B/7/02 |
| JP | 2002-189178 | 7/2002 | .......... | G02B/26/08 |

* cited by examiner

*Primary Examiner*—Phuc T. Dang
(74) *Attorney, Agent, or Firm*—Hayes & Soloway P.C.

(57) ABSTRACT

A driver circuit substrate is prepared and a mirror substrate is so provided as to be placed on the driver circuit substrate. Nine mirror elements are lad out on the mirror substrate in a 3×3 matrix form. The mirror elements are prepared by a microelectromechanical system (MEMS). An insulating substrate is provided on the driver circuit substrate and a driver circuit which drives a light reflecting mirror element is provided on the insulating substrate. The driver circuit substrate is connected to the mirror substrate via a resin layer of a thermosetting adhesive or the like.

2 Claims, 27 Drawing Sheets

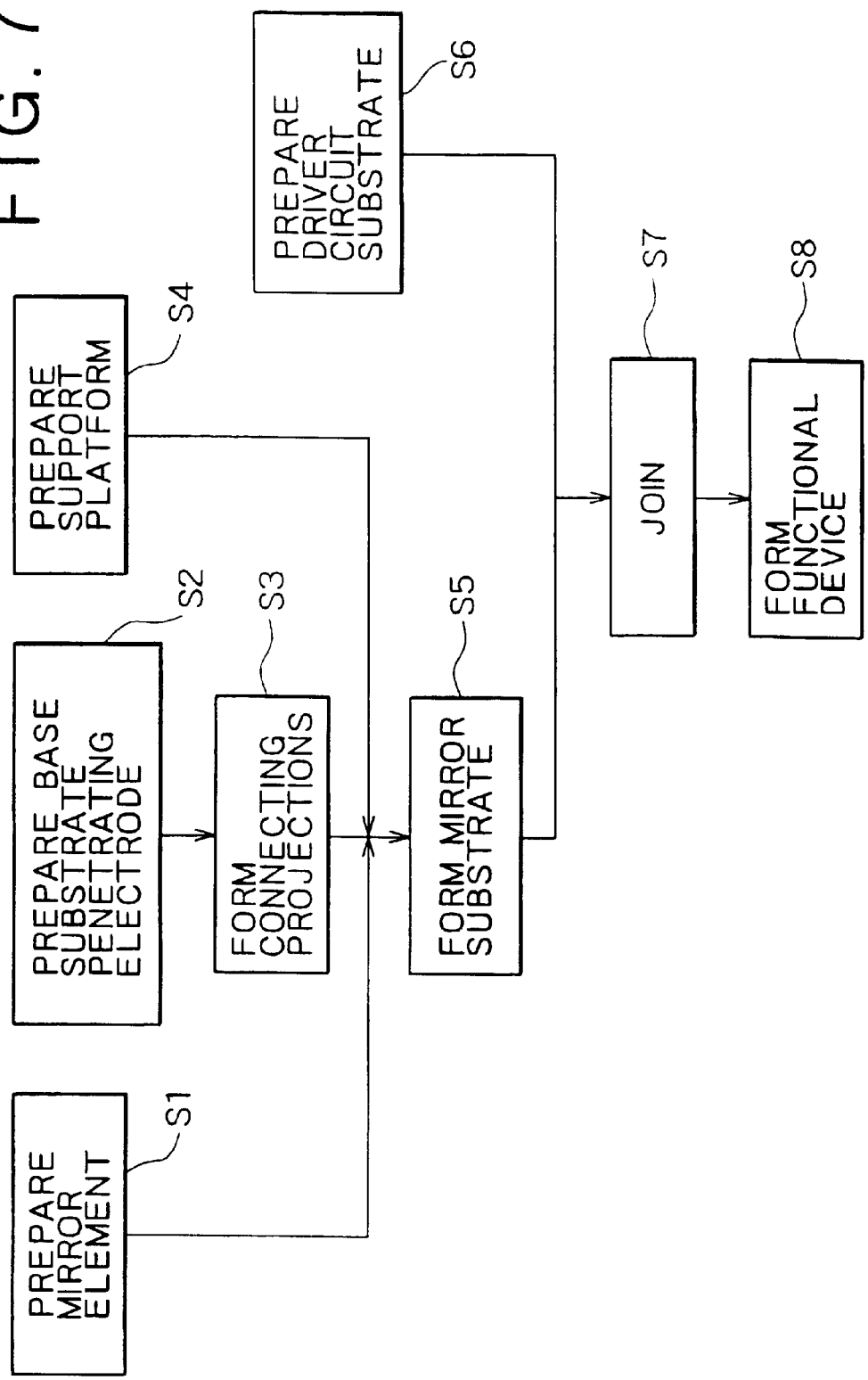

FUNCTIONAL DEVICE, METHOD OF MANUFACTURING THEREFOR AND DRIVER CIRCUIT

CROSS-REFERENCE TO RELATED APPLICATION

This application is a divisional application of U.S. application Ser. No. 10/215,912 filed Aug. 9, 2002.

BACKGROUND OF THE INVENTION

1. Field of the Invention

The present invention relates to a functional device having functional elements which perform processing, such as conversion of input signals, alteration of a path, selection of a wavelength and enabling/disabling electrical connection, method of manufacturing for the functional device, and a driver circuit, more particularly, to a functional device which controls the operations of functional elements by a microelectromechanical section.

2. Description of the Related Art

For optical connection network systems, such as an optical fiber system of a wavelength division multiplexing (WDM) type, there are growing needs for the technique that switches optical paths and the technique that selects light of a predetermined wavelength from input light. Such an optical connection network system uses an optical switch at each node on a network, which selectively demultiplexes light of a predetermined wavelength from light with a plurality of wavelengths and then changes the path of the light. The probable future increase in the amount of communication information to be transferred requires the multi-channel and large-scale design of optical devices, such as an optical switch.

Because an optical switch classified into the optical devices changes the path for light without photoelectric conversion of the light, it has characteristics, such as the possible minimizing of the delay time, no dependence on the transfer speed and the expandability. Conventional methods of providing optical switches, which have been proposed so far, include a method which employs the mechanical motion of an optical fiber, a method which is based on the Faraday rotation and a method which uses a reflecting mirror.

Because optical switch which uses a reflecting mirror and employs a microelectromechanical system (MEMS) for the reflecting mirror and a drive apparatus which drives the reflecting mirror is manufactured by using the microfabrication technology to fabricate semiconductor integrated circuits, it is advantageous in cost reduction and large-scale fabrication and is expected as an optical switch which can sufficiently meet the need for the larger scale fabrication of optical switches which will be originated from the future multi-channel design.

For example, Japanese Patent Laid-Open No. 2000-314846 discloses a reflecting mirror formed by an MEMS. Specifically, Japanese Patent Laid-Open No. 2000-314846 discloses a technique of providing a reflecting mirror coupled to a supporting block in a rotatable manner by a beam portion, attaching an electrode to the supporting block and applying a voltage to the electrode so that the operation of the reflecting mirror is controlled by electrostatic force generated between the electrode and the reflecting mirror. Japanese Patent Laid-Open No. 2001-117025 discloses a reflecting mirror formed by an MEMS too. Further, Japanese Patent Laid-Open No. 330254/1999 discloses a technique such that in a semiconductor device equipped with switch means which has a plurality of MOS transistors formed on a substrate and a plurality of switch elements or MEMS formed on the MOS transistors, the switch elements perform switching by moving interconnections provided movably using the Coulomb force. Japanese Patent Laid-Open No. 330254/1999 also describes that with that technique, a variable logic LSI having a higher freedom of design can be realized by providing invariable connection in a semiconductor device with the MOS transistors and providing variable connection with the switch elements.

Japanese Patent Laid-Open No. 144596/1999 discloses a technique of forming an RF switch using an MEMS on a semiconductor monolithic microwave integrated circuit substrate. This technique provides a beam supported rotatably in a seesaw form on the substrate and applying a voltage to an electrode arranged near the beam, thereby generating electrostatic force between the beam and the electrode, which turns the beam. This allows a terminal formed on the substrate to have contact or no contact to a terminal formed on the bottom side of the beam, thereby opening or closing the switch. Japanese Patent Laid-Open No. 144596/1999 describes that the use of the technique can form an array of RF switches with a good sensitivity.

U.S. Pat. No. 5,963,788 (Carole C. Barron, et al.) discloses a technique of preparing a driver circuit which drives MEMS elements on the same silicon substrate on which the MEMS elements are formed.

Japanese Patent Laid-Open No. 2002-36200 discloses a technique of integrating MEMS device modules and an IC control circuit module needed to drive the MEMS device modules on a common systems connecting substrate. This can ensure easy separation of the MEMS device modules and the IC control circuit module for replacement or repair.

The above-described prior arts however have the following problems. While electrostatic force, magnetic force, a piezoelectric effect, thermal expansion and so forth are available as the drive force for a functional element, such as a reflecting mirror or RF switch, a device equipped with such a functional element needs a driver circuit to generate such drive force. In case where electrostatic force is used as the drive force for a reflecting mirror, for example, a driver circuit which selects and controls an MEMS to be driven is needed in addition to an applied voltage generating circuit which generates a voltage.

As shown in FIG. 1 of the aforementioned Japanese Patent Laid-Open No. 2001-117025, for example, such a conventional driver circuit is prepared on a substrate separate from a substrate on which a functional element, such as a reflecting mirror, and a drive apparatus for driving the functional element (hereinafter generally called "MEMS element") are formed, and is connected to the substrate on which the MEMS element is formed by wire bonding or a flexible substrate or the like. If the scale of an optical device becomes larger due to the multi-channel design and the number of MEMS elements to be driven is increased, the number of interconnections to connect the driver circuit to the individual MEMS elements and the scale of the driver circuit increase, resulting in the enlargement of the overall apparatus. That is, although driving and controlling MEMS elements require electrodes, the number of terminals for exchanging drive control signals with an external unit is increased due to the multi-channel design and the large-scaling of the array, thereby increasing the area needed to lay out the associated interconnections. If two electrodes are needed to drive a single MEMS element, for example, a total of $2n^2$ electrodes are needed for the square matrix layout (array) of n rows by n columns (n being an integer), and terminals equal in number to $2n^2$ should be provided on the device, which would result in a larger area needed to layout the interconnections to connect to those terminals.

According to the technique disclosed in U.S. Pat. No. 5,963,788, a cavity portion is provided on the top surface of a silicon substrate and an MEMS element is formed in the cavity portion after which a driver circuit is formed in an area in the top surface of the silicon substrate, which is different from the cavity portion. The technique therefore requires a step of protecting the MEMS element at the time of forming the driver circuit and a planarization step after the formation of the driver circuit. This results in an undesirable increase in the number of required steps. In case of laying out an array of several thousand light reflecting mirrors formed by MEMS elements in order to achieve the multi-channel design, the ratio of the area of the cavity portions occupying on the top surface of the silicon substrate increases, thus reducing the mechanical strength of the silicon substrate at the time of preparing the apparatus.

Further, as the technique disclosed in Japanese Patent Laid-Open No. 2002-36200 arranges a plurality of MEMS modules on the systems connecting substrate in a replaceable manner, it is necessary to secure the inter-module alignment precision. In case where each MEMS module includes a mirror for use in optical communications, for example, the optical paths among the modules should be secured precisely. This would result in a complicated assembling process or lower the reliability of assembled apparatuses. Because each MEMS module takes a sealed structure itself, it has a larger volume than an MEMS chip, which makes the apparatus larger in the large-scale array design.

SUMMARY OF THE INVENTION

Accordingly, it is an object of the invention to provide a functional device which can suppress a size enlargement originated from an increase in the number of interconnections that is caused by a multi-channel design, is easy to fabricate, has a higher mechanical strength and contributes to cost reduction and an improvement on the reliability, a method of manufacturing the functional device and a driver circuit mounted on the functional device.

A functional device according to the invention comprises a plurality of functional elements each of which processes an input signal and outputs that processed signal; a driver circuit substrate having a substrate and a driver circuit, provided on the substrate, for driving the functional elements; a joining layer having an insulating layer, formed of an insulating material, for joining the functional elements to the driver circuit substrate and connection terminals, provided in the insulating layer, for connecting the functional elements to the driver circuit.

According to the invention, the functional elements and the driver circuit substrate which has the driver circuit for driving the functional elements are provided and the functional elements are connected to the driver circuit substrate by the joining layer. Even in case where a large number of functional elements are provided so that the functional device takes a multi-channel design, therefore, it is possible to suppress the enlargement of the overall functional device which is originated from an increase in the area of the driver circuit.

As the distances between the driver circuit and the functional elements can be made shorter, the interconnections therebetween can be made as short as possible. Further, because the driver circuit is formed on the driver circuit substrate and the functional elements are joined to the driver circuit substrate by the joining layer, the fabrication is easier, the strength of the substrate does not become lower, and there is less integration and physical misalignment between the driver circuit substrate and the functional elements, thus making it possible to improve the reliability of the functional device and reduce the production cost, as compared with the case where functional elements are formed directly on the substrate.

Furthermore, the joining of the functional elements to the driver circuit substrate by the joining layer can improve the reliability of the functional device and miniaturize the device, as compared with the case where replaceable modules are used. Because the functional elements and the driver circuit substrate can be fabricated independently, it is possible to independently determine whether the functional elements and the driver circuit substrate are satisfactory or not. This can lead to an improvement of the overall yield of functional devices.

It is preferable that the functional device should further comprise input/output terminals for connecting the driver circuit to an external circuit and the number of the input/output terminals should be less than the number of the connection terminals. This can reduce the number of interconnections between the driver circuit and an external circuit, making it possible to decrease the area of the portion that is needed for the layout of the interconnections.

Each of the functional elements may have a processing element for processing the input signal; a microelectromechanical section for supporting the processing element in a movable manner; and a drive electrode for moving the processing element by generating electrostatic force between the drive electrode and the processing element to which a voltage from the driver circuit is applied. This can allow an electrical signal output from the driver circuit to be converted to the mechanical operation of the processing element with a simplified structure.

In this case, each of the functional elements may have at least three drive electrodes. This design can allow the processing element to be moved freely, thus increasing the degree of freedom of signal processing.

The signal may be an optical signal, the processing element may be a light reflecting mirror for reflecting at least part of the optical signal, the microelectromechanical section supports the light reflecting mirror in manner rotatable, and the functional device may perform optical switching as the drive electrode controls an angle of the light reflecting mirror and the light reflecting mirror selectively outputs the optical signal input.

In this case, the drive electrode may be comprised of a transparent conductor, the light reflecting mirror may be semitransmissive, the substrate may be formed of a transparent insulator and the driver circuit substrate may have a photodetecting substrate including a photodetecting element on that side which does not face the functional elements. This can allow an optical signal to be always monitored at the time of performing optical communications using this optical device. As a result, it is possible to detect an abnormality of an optical signal which passes the functional device and the disconnection or the like of the communication path.

Alternatively, the signal may be an optical signal, the processing element may be a filter for selectively separating light of an arbitrary wavelength from the optical signal, the microelectromechanical section may support the filter in a reciprocatable manner, and as the drive electrode of the functional device controls a position of the filter to intervene the filter in a pass band of the optical signal, the filter may selectively separate light of an arbitrary wavelength from the optical signal input and output the separated light.

Alternatively, the signal may be an electrical signal, the processing element may be a switch member which, when deformed, connects an input terminal to which the electrical signal is input to an output terminal, and the drive electrode may deform the switch member to select enabling or disabling of supply of the electrical signal to the output terminal.

The driver circuit may have an array of transistors; a single gate line or a plurality of gate lines connected to gate electrodes of the transistors; a plurality of drain/source lines connected to source electrodes of the transistors; terminals, connected to drain electrodes of the transistors and the drive electrodes, for applying voltages applied to the drain electrodes to the drive electrodes; and a drain/source driver circuit for selectively inputting a signal to the drain/source lines. Even if an optical switch takes a multi-channel design and has a large scale, therefore, the circuit portion is not enlarged, thus further suppressing the enlargement of the functional device.

Another functional device according to the invention comprises a functional-element movably supporting structure having a functional element for performing optical processing on at least part of light input to a surface of the functional element and outputting the processed light and a microelectromechanical section for supporting the functional element and controlling an operation of the functional element; and a driver-circuit-substrate structure arranged on that side where the functional element is not provided as seen from the functional-element movably supporting structure and having a substrate of an insulator and a driver circuit, formed on the substrate, for controlling an operation of the microelectromechanical section.

According to the invention, the functional-element movably supporting structure having the functional element and the microelectromechanical section is provided and the driver-circuit-substrate structure is arranged on that side where the functional element is not provided as seen from the functional-element movably supporting structure. Even in case where the functional device takes a multi-channel design, therefore, it is possible to suppress the enlargement of the overall functional device which is originated from an increase in the area of the driver circuit.

As the driver circuit is formed on the substrate of an insulator in the driver-circuit-substrate structure, there is less integration and physical misalignment between the driver-circuit-substrate structure and the functional-element movably supporting structure, thus making it possible to improve the reliability of the functional device and reduce the production cost. Further, because the distance between the driver circuit and the microelectromechanical section can be made shorter, the interconnections therebetween can be made as short as possible, thereby ensuring the miniaturization of the functional device and an improvement on the reliability thereof.

A method of manufacturing for a functional device according to the invention comprises the steps of: forming a processing element and a microelectromechanical section for supporting the processing element the processing element in a movable manner on a silicon substrate; forming a through hole in an insulating substrate; forming a first electrode on a first side of the insulating substrate and a second electrode on a second side of the insulating substrate, the second electrode being connected to the first electrode via the through hole; preparing a functional-element movably supporting structure by joining the processing element and the microelectromechanical section to the insulating substrate; preparing a driver circuit substrate by forming on a substrate a driver circuit which drives a functional element; and joining the functional-element movably supporting structure to the driver circuit substrate in such a way that the driver circuit is connected to the second electrode.

A driver circuit according to the invention, which is provided in a functional device having a plurality of functional elements for each processing an input signal and outputting the processed signal and drives the functional elements, comprises an array of transistors; a single gate line or a plurality of gate lines connected to gate electrodes of the transistors; a plurality of drain/source lines connected to source electrodes of the transistor; terminals, connected to drain electrodes of the transistors and the functional elements, for applying voltages applied to the drain electrodes to the functional elements; and a drain/source driver circuit for selectively inputting a signal to the drain/source lines.

As apparent from the above, the invention can provide a functional device which, even if taking a multi-channel design, can suppress the enlargement of the functional device and ensure cost reduction and an improvement on the optical communications.

BRIEF DESCRIPTION OF THE DRAWINGS

FIG. 7 is a flowchart illustrating a manufacturing method for the functional device according to the embodiment;

DETAILED DESCRIPTION OF THE PREFERRED EMBODIMENTS

Figure 1:
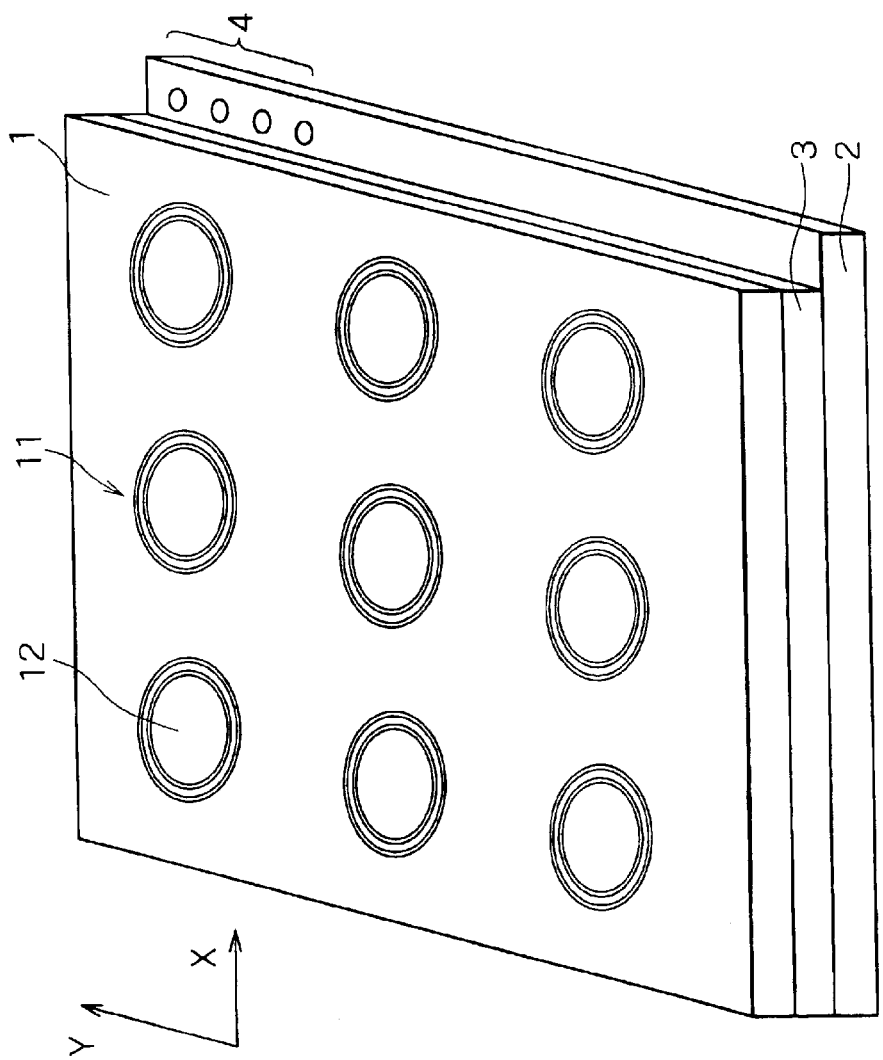
FIG. 1 is a perspective view showing the structure of a functional device according to a first embodiment of the invention.
Figure 2:
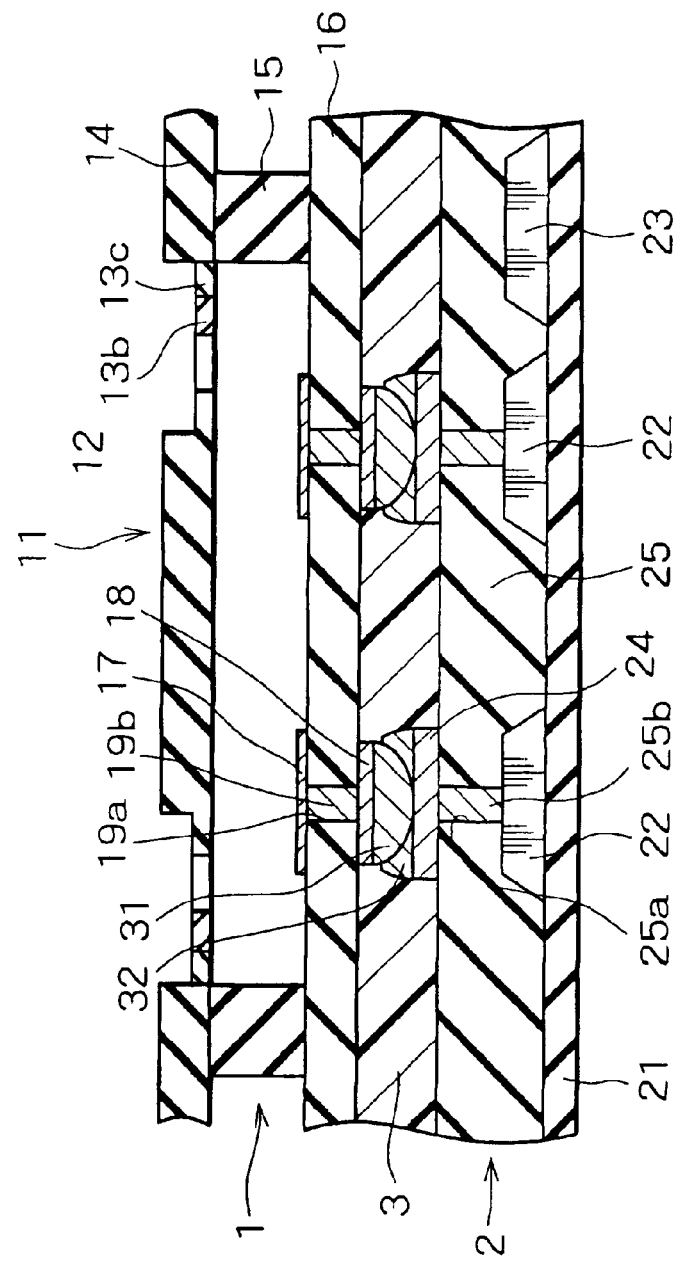
FIG. 2 is a cross-sectional view of a cross section passing the X—X axis of a mirror element 11 and perpendicular to the surface of a mirror frame 14.
Figure 3:
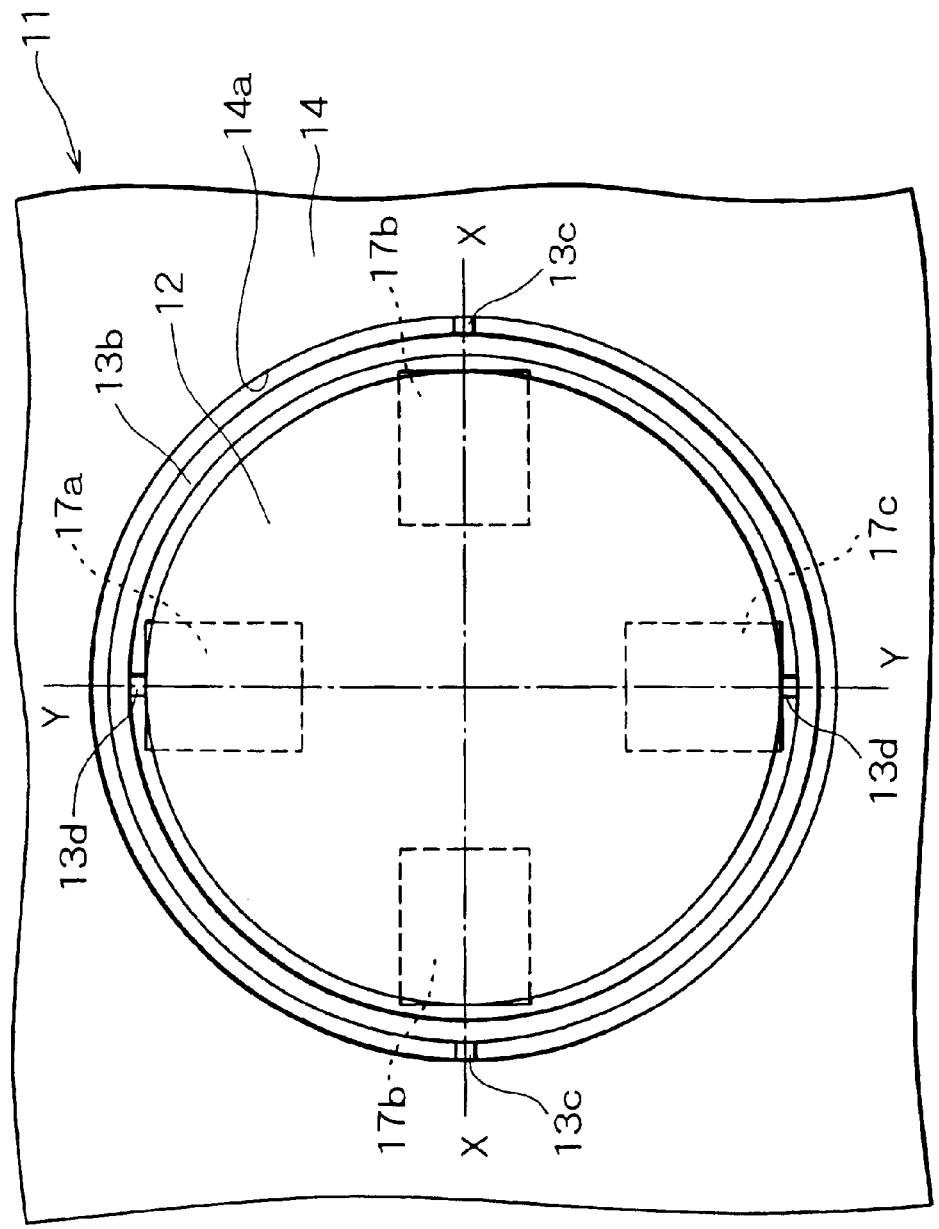
FIG. 3 is an enlarged plan view showing the structure of the mirror element 11.
Figure 4:
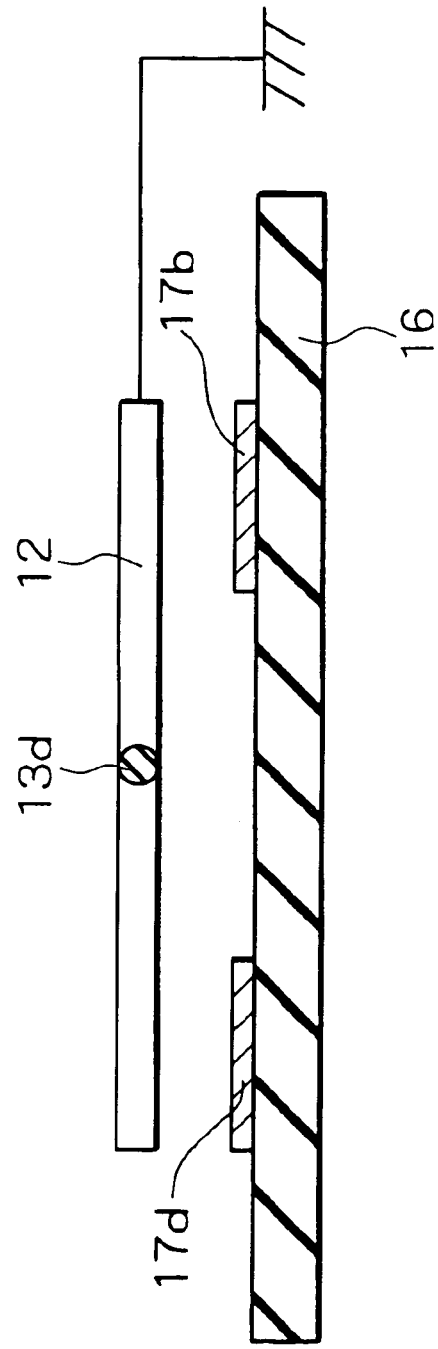
FIG. 4 is a cross-sectional view showing the layout of electrodes of a light reflecting mirror according to the embodiment.
Figure 5:
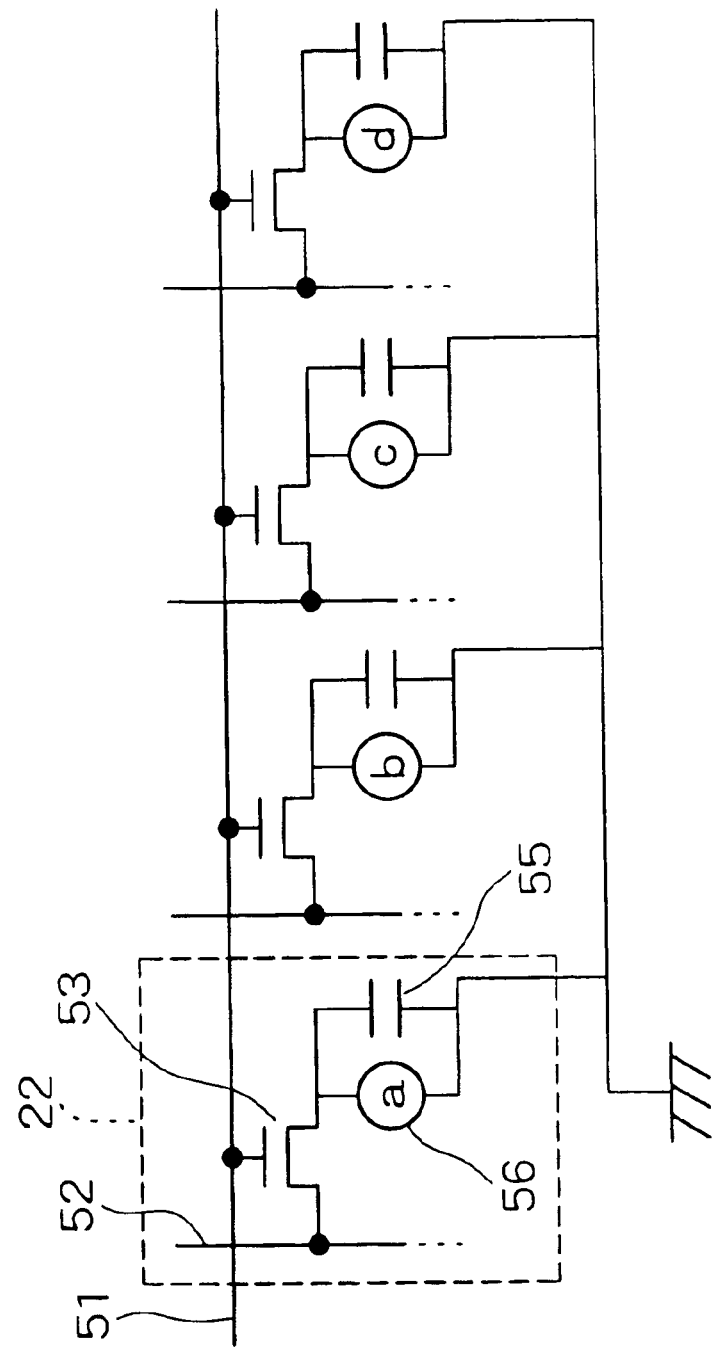
FIG. 5 is an equivalent circuit diagram showing four mirror element switch sections which drive a single light reflecting mirror of the functional device according to the embodiment.
Figure 6:
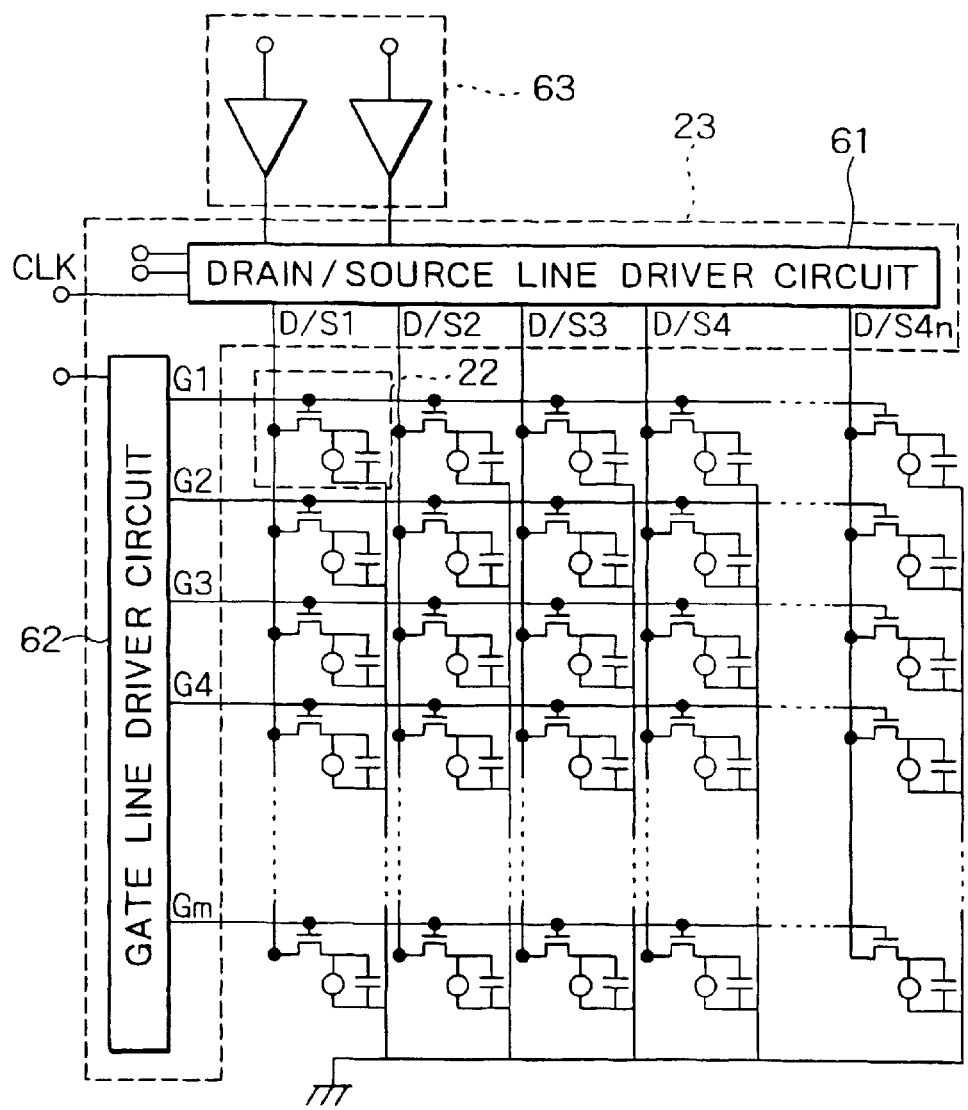
FIG. 6 is an equivalent circuit diagram showing the structures of the mirror element switch section and a driver circuit section of the functional device according to the embodiment.

Preferred embodiments of the invention will be specifically described below with reference to the accompanying drawings. To begin with, the first embodiment of the invention will be discussed. FIG. 1 is a perspective view showing the structure of a functional device according to the embodiment, FIG. 2 is a cross-sectional view of a mirror element 11, FIG. 3 is an enlarged plan view showing the detailed structure of the mirror element 11, FIG. 4 is a cross-sectional view showing the layout of electrodes of a light reflecting mirror, FIG. 5 is an equivalent circuit diagram showing four mirror element switch sections which drive a single light reflecting mirror of the functional device, and FIG. 6 is an equivalent circuit diagram showing the structures of the mirror element switch section and a driver circuit section. Note that FIG. 2 is a cross-sectional view of a cross section passing the X—X axis shown in FIG. 3 and perpendicular to the surface of a mirror frame 14. The functional device according to the embodiment is an optical switch which uses nine light reflecting mirrors, as functional elements, arranged in an array and uses electrostatic force as the drive force to drive the light reflecting mirrors.

As shown in FIG. 1, the optical switch or the functional device according to the embodiment is provided with a driver circuit substrate 2 and has a mirror substrate 1 provided in such a way as to be laminated on the driver circuit substrate 2. The driver circuit substrate 2 and the mirror substrate 1 are connected together by a resin layer 3. A connection member 32 (see FIG. 2) is provided in the resin layer 3, and the resin layer 3 and the connection member 32 form a joining layer. The mirror substrate 1 is provided with at least one mirror element 11, e.g., nine mirror elements 11 laid out in a matrix form (3 rows by 3 columns). The driver circuit substrate 2 is provided with a circuit, which drives and controls the mirror elements 11 and is connected to the mirror substrate 1 by the resin layer 3 of a thermosetting adhesive or the like and the connection member 32 (see FIG. 2).

The mirror substrate 1 and the driver circuit substrate 2 have approximately parallelepiped shapes and have one sides nearly equal in length while the length of the other side of the driver circuit substrate 2 is slightly longer than the length of the other side of the mirror substrate 1. This provides an area on the top surface of the driver circuit substrate 2 which is not covered with the mirror substrate 1 and where, for example, four external input ports 4 are provided.

As shown in FIG. 2, the mirror substrate 1 is provided with a base substrate 16 formed of an insulator or silicon covered with an insulator, such as silicon oxide, supporting blocks 15 of an insulator, such as glass, are provided at predetermined intervals on the base substrate 16, and the mirror elements 11 are provided on the supporting blocks 15 and held at predetermined intervals by the supporting blocks 15. As will be discussed later, each mirror element 11 has such a structure as to be able to have a three-dimensional motion. The mirror elements 11 and the base substrate 16, which is provided with through electrodes to be discussed later, are connected together at predetermined intervals via the supporting blocks 15, thereby forming the mirror substrate 1.

Through holes 19a are formed in the base substrate 16 and four drive electrodes 17 for driving a single mirror element 11 with electrostatic force are provided, for each mirror element 11, above the through holes 19a in the top surface of the base substrate 16 (on the side of the mirror element 11). Connecting electrodes 18 are provided under the through holes 19a at the back surface of the base substrate 16. The drive electrodes 17 and the connecting electrodes 18 are respectively connected together by the associated through holes 19a, thereby forming through electrodes. A conductor 19b of a solder or tin (Sn) may be buried in each through hole 19a. A connecting projection (bump) 31 of Au (gold) or solder is provided on the top surface of each connecting electrode 18.

As shown in FIGS. 3 and 4, the mirror element 11 comprises a disc-like mirror body 12, a ring-like support 13 which rotatably supports the mirror body 12 and a mirror frame 14. The support 13 is a microelectromechanical section which supports the mirror body 12 as a processing element in a movable manner. An opening 14a is formed in the mirror frame 14. The support 13 is arranged in the opening 14a of the mirror frame 14 and comprises a ring 13b, two shaft members 13c and two shaft members 13d. The ring 13b is arranged inside the opening 14a and the mirror body 12 is arranged inside the ring 13b.

The two shaft members 13c are coupled to the inner wall of the opening 14a of the mirror frame 14 in such a way that their axial directions are the X direction, and rotatably support the ring 13b. Accordingly, the ring 13b is coupled to the mirror frame 14 via the two shaft members 13c rotatably about the X—X axis. The two shaft members 13d are coupled to the inner wall of the ring 13b in such a way that their axial directions are the Y direction, and rotatably support the mirror body 12. Accordingly, the mirror body 12 is coupled to the ring 13b via the two shaft members 13d rotatably about the Y—Y axis. As a result, the support 13 rotatably supports the mirror body 12 with the X—X axis and the Y—Y axis as rotational axes, which respectively extend in two directions parallel to the top surface of the mirror frame 14 and perpendicular to each other, i.e., in the X direction and Y direction. This makes it possible to direct the mirror body 12 in any direction, so that the mirror body 12 can output light input from a light input path (not shown) to a light output path (not shown) in an arbitrary direction.

The mirror body 12 may be of a full reflection type which fully reflects input light, e.g., a thick metal film coated on a substrate, or may be of a semitransmissive type which reflects part of input light and passes the remaining part directly, e.g., a thin metal film coated on a transparent substrate.

For a single mirror body 12, four drive electrodes 17 are provided in areas on the base substrate 16 under the mirror body 12. In FIG. 3, the four drive electrodes 17 are indicated by symbols "17a" to "17d". The mirror drive electrodes 17b and 17d are arranged below the rotational axis of the ring 13b with respect to the mirror frame 14 at symmetrical positions with respect to a line passing the center of the mirror body 12 and perpendicular to the top surface of the base substrate 16 (hereinafter called the center axis of the mirror body 12). The mirror drive electrodes 17a and 17c are arranged below the rotational axis of the mirror body 12 with respect to the ring 13b at symmetrical positions with respect to the center axis of the mirror body 12. The mirror body 12, the support 13 and the mirror drive electrodes 17a to 17d constitute a functional element.

As shown in FIG. 2, the driver circuit substrate 2 is provided with a substrate 21 of an insulator, such as glass, and element switch sections 22 each constituted by a thin-film semiconductor or the like prepared in the thin film process are provided on the substrate 21. The element switch sections 22 provided are equal in number to the drive electrodes 17. A driver circuit section 23 which selectively drives the element switch sections 22 is provided on the substrate 21. An insulator layer 25 which covers the element switch sections 22 and the driver circuit section 23 is provided on the substrate 21. Contact holes 25a are formed in the insulator layer 25 at portions corresponding to the element switch sections 22, and conductors 25b are buried in the contact holes 25a. The conductors 25b are connected to external electrodes (not shown) of the element switch sections 22. Surface electrodes 24 are provided on those areas of the top surface of the insulator layer 25 which lie above the associated contact holes 25a. The surface electrodes 24 are connected to the external electrodes (not shown) of the element switch sections 22 by the conductors 25b in the contact holes 25a.

The driver circuit substrate 2 is further provided with external input ports 4 (see FIG. 1) which include input terminals to which a signal for selecting a predetermined element switch section 22, a clock signal and so forth input to the driver circuit section 23 from an external control circuit (not shown) are input and input terminals for receiving applied voltages to drive the mirror elements 11.

The connecting projections (bumps) 31 provided on that side of the mirror substrate 1 which faces the driver circuit substrate 2 respectively abut on the surface electrodes 24 provided on that side of the driver circuit substrate 2 which faces the mirror substrate 1. The connection members 32 of a solder or a conductive adhesive are provided in such a way as to cover the connecting projections 31 and the surface electrodes 24. The associated connecting projection 31 and surface electrode 24 are connected together by pressure bonding or the like and are covered around with the associated connection member 32 for reinforcement. The resin layer 3 of a thermosetting adhesive or the like is filled around the connecting electrodes 18, the connecting projections 31, the surface electrodes 24 and the connection members 32 between the base substrate 16 and the insulator layer 25 to seal them.

As the mirror substrate 1 is laminated on the driver circuit substrate 2 via the connection members 32 and the resin layer 3, the drive electrodes 17 of the mirror substrate 1 are connected to the respective element switch sections 22 of the driver circuit substrate 2 via the conductors 19b, the connecting electrodes 18, the connecting projections 31, the connection members 32, the surface electrodes 24 and the conductors 25b. The drive electrodes 17, the conductors 19b, the connecting electrodes 18, the connecting projections 31, the surface electrodes 24, conductors 25b and the element switch sections 22 are arranged in the named order along a nearly perpendicular direction.

Although the illustrated embodiment has the connecting projections 31 provided on the top surfaces of the respective connecting electrodes 18 and abutting on the respective surface electrodes 24, the connecting projections 31 may be provided on the respective surface electrodes 24 in abutment with the respective connecting electrodes 18. In this case, the connection members 32 are formed in such a way as to cover the connecting projections 31 and the connecting electrodes 18.

Although the illustrated embodiment has the connecting electrodes 18 provided directly below the mirror drive electrodes 17 and connected to the respective surface electrodes 24 at those positions, the surface electrodes 24 and connecting electrodes 18 can be arranged at arbitrary positions of the insulator layer 25 and the base substrate 16 within the range where the electrical connection between the drive electrodes 17 and the element switch sections 22 is secured.

The element switch section 22 is constructed by an equivalent circuit shown within the broken-line area in FIG. 5. FIG. 5 shows the equivalent circuit of the circuit that drives the single light reflecting mirror 11. A thin film transistor (TFT) 53 whose gate electrode is connected to a gate line 51 is provided in the element switch section 22. A drain/source line 52 is connected to the source electrode of the TFT 53 and a holding capacitor 55 and a terminal 56 are connected in parallel between the drain electrode of the TFT 53 and a ground electrode. The holding capacitor 55 holds the orientation of the mirror body 12 when the gate line 51 is disabled to disable the TFT 53, and supplies the charges of the drive electrode 17 that have been lost due to the natural discharging. While the capacitance of the holding capacitor 55 is determined by the gate line scan frequency and the number of the mirror elements 11, it needs to be set in such a way that the charges can be retained until the next gate line scanning. The terminal 56 comprises a terminal on the TFT side and a terminal on the ground potential side. The former TFT-side terminal is an external electrode of the element switch section 22 and is connected to the conductor 25b. As mentioned earlier, the conductor 25b is connected to the drive electrode 17 via the surface electrode 24, the connecting projection 31, the connecting electrode 18 and the conductor 19b. The ground-potential-side terminal of the terminal 56 is connected to the ground electrode (see FIG. 4) of the mirror body 12.

The four element switch sections 22 form a single group which is connected to the common gate line 51 to drive a single mirror element 11. The terminals 56 of the individual element switch sections 22 in the single group are respectively connected to the mirror drive electrodes 17a, 17b, 17c and 17d.

As shown in FIG. 6, a plurality of element switch sections 22 are laid out in an array in the functional device according to the embodiment. In case where the mirror elements 11 are laid out in an m×n array, due to four element switch sections 22 needed to drive a single mirror element 11 as mentioned above, the element switch sections 22 are laid out in an array of m×4n. Because the mirror elements 11 are laid out in a 3×3 array, for example, the element switch sections 22 are laid out in an array of 3×12. The element switch sections 22 in each column are connected to the common drain/source line 52. Therefore, there are a total of 4×n drain/source lines 52 in the optical device. The drain/source lines 52 are connected to scan columns D/S1, D/S2, . . . , and D/S4n of a drain/source line driver circuit 61 which selectively applies a voltage to the drain/source lines 52.

The element switch sections 22 in each row are connected to the common gate line 51. Therefore, there are a total of m gate lines 51 in the optical device. The gate lines 51 are connected to scan rows G1, G2, . . . , and Gm of a gate line driver circuit 62 which selectively applies a voltage to the gate lines 51. The drain/source line driver circuit 61 and the gate line driver circuit 62 constitute the driver circuit section 23 that controls and drives the element switch sections 22. Further, an applied voltage generating section 63 of at least two channels is connected to the drain/source line driver circuit 61. The applied voltage generating section 63 applies a voltage to the drain/source lines 52 via the drain/source line driver circuit 61 and is provided outside the functional device.

The operation of the functional device according to the embodiment will be discussed below. As shown in FIGS. 5 and 6, the gate line driver circuit 62 of the driver circuit section 23 scans and sequentially drives the scan rows G1, G2, G3, . . . and Gm and enables (turns on) all the TFTs 53 connected to a single gate line 51 at a time.

The applied voltage generating section 63 supplies two-channel applied voltages for directing the mirror body 12 in an arbitrary direction to the drain/source line driver circuit 61 in response to an instruction from the control section (not shown). The drain/source line driver circuit 61 selects two drive electrodes for directing the mirror body 12 in a predetermined direction from those scan columns (e.g., D/S1 to D/S4) which are connected to the drive electrodes 17a, 17b, 17c and 17d (see FIG. 3) and connects the selected two scan columns to the applied voltage generating section 63. As a result, the two-channel applied voltages supplied from the applied voltage generating section 63 are respectively applied to the selected two scan columns. Consequently, of the TFTs 53 of the element switch sections 22 connected to the single gate line 51 that is applied with the voltage by the gate line driver circuit 62, those TFTs 53 which are connected to the two drain/source lines 52 selected by the drain/source line driver circuit 61 are enabled (turned on) and the voltages input to the drain/source lines 52 are applied to the terminals 56 of the associated element switch sections 22. When the gate line driver circuit 62 applies a voltage to the scan row G1 and the drain/source line driver circuit 61 selects the scan columns D/S1 and D/S3 and applies voltages thereto, for example, the element switch sections 22 that are located at the intersections of the scan row G1 and the scan columns D/S1 and D/S3 are driven.

In response to an instruction coming from the control section (not shown) via a drain/source-line select signal line (not shown), the drain/source line driver circuit 61 changes the two scan columns to be connected to the applied voltage generating section 63 and applies predetermined voltages to the two scan columns. The drain/source line driver circuit 61 has a logic circuit (not shown) or a circuit, such as an analog switch (not shown), and sequentially changes the drain/source lines 52 to be connected to the applied voltage generating section 63, every four lines, based on a clock signal from the control section (not shown) by means of the logic circuit or the analog switch or the like. As a result, it is possible to select two of the drain/source lines 52 of the element switch sections 22 arranged in the next four columns in the same row and apply predetermined voltages to the selected lines.

As shown in FIG. 2, the TFT-side terminal of the terminal 56 (see FIG. 5) of the element switch section 22 is connected to the drive electrode 17 via the conductor 25b, the surface electrode 24, the connecting projection 31, the connecting electrode 18 and the conductor 19b. Therefore, the voltage applied to the terminal 56 of the element switch section 22 is applied to the drive electrode 17. Because the individual terminals 56 included in a group of four element switch sections 22 are respectively connected to the four drive electrodes 17a, 17b, 17c and 17d which drive a single mirror element 11, applying voltages to two of the four element switch sections 22 applies the voltages to two drive electrodes selected from the one set of drive electrodes 17a, 17b, 17c and 17d.

As shown in FIG. 4, when a predetermined voltage is applied to the drive electrode 17b or 17d with the mirror body 12 being taken as the ground, electrostatic force is generated between the mirror body 12 and the drive electrode 17b or 17d, so that the mirror body 12 turns around the rotational axis that extends in the Y direction. Because the mirror body 12 has rotational axes perpendicular to each other and a total of four drive electrodes 17 are provided at positions symmetrical to one another with respect to the center axis of the mirror body 12, as mentioned earlier, the mirror body 12 can be inclined in an arbitrary direction by applying a voltage to one or two drive electrodes 17 of the four drive electrodes 17a, 17b, 17c and 17d. In case where voltages are simultaneously is applied to two drive electrodes 17, those two drive electrodes are arranged in directions perpendicular to each other as seen from the center axis of the mirror body 12. For example, they are drive electrodes 17a and 17b as shown in FIG. 3. No voltages are applied to the drive electrodes 17a and 17c simultaneously. In the above-described manner, the mirror body 12 can be directed in an arbitrary direction to reflect the input light in the arbitrary direction.

The gate line driver circuit 62 keeps a single gate line 51 enabled based on a clock signal from the control section (not shown) until driving of all the mirror elements 11 connected to the single gate line 51 is completed. After the driving of the mirror element 11 in the last (4n-th) column connected to the gate line 51 is completed, the gate line driver circuit 62 enables the next gate line 51 and likewise performs the aforementioned operation for the row. As this operation is performed row by row until the last row, voltages are applied to those individual drive electrodes 17 in the TFTs 53 whose gate electrodes are connected to the same gate line which direct the mirror body 12. All the mirror elements 11 provided in the optical switch of the embodiment can be driven in this way.

As described above, drive control of the light reflecting mirror elements arranged in an m×n array can be realized by performing a scanning operation synchronous with the clock signal from the control section (not shown).

Although the foregoing description of the embodiment has been given of the case where the directions along which the drive electrodes 17a, 17b, 17c and 17d are arranged match with the directions along which the shaft members 13c and 13d are arranged or the directions in which the rotational axes of the mirror body 12, those directions may not match with each other. For example, the directions may be shifted by, for example, 45°.

Although the connecting electrode 18 is connected to the surface electrode 24 by pressure bonding or the like of the connecting projection (bump) 31 and the connection member 32 in the embodiment, the connection may be achieved by BGA (Ball Grid Array) by which a solder ball is provided on the surface electrode 24 or the connecting electrode 18 to connect the electrodes 18 and 24 together.

Although the applied voltage generating section 63 (see FIG. 6) generates voltages of two channels in order to effect the minimum mirror driving in the embodiment, the applied voltage generating section 63 may generate voltages of four channels or channels equivalent to n columns of light reflecting mirrors to be connected (i.e., 4n channels). In case of generating voltages of four channels, the function of selecting and connecting two of the four drain/source lines 52 in the drain/source line driver circuit 61 which are connected to a single mirror element switch section 22 and the function of changing and connecting the four drain/source lines 52 are not required, so that the drain/source line driver circuit 61 has only to have the function of sequentially changing the drain/source lines 52 every four lines. In case where the applied voltage generating section 63 generates voltages of channels which are equivalent to n columns, the control section provides instructions equal in number to the number of channels equivalent to n columns (i.e., 4n channels), but the function of selectively changing the drain/source lines 52 in the drain/source line driver circuit 61 is not necessary at all. This requires only the scanning of the gate lines 51 at the time of driving the optical device, thus making it possible to make the overall control of the array of mirror elements 11 faster.

Although the applied voltage generating section 63 is provided outside the driver circuit substrate 2 in the illustrated embodiment, the applied voltage generating section 63 may be provided in the driver circuit section 23 on the driver circuit substrate 2.

Further, although the support 13 has a double ring structure in the illustrated embodiment, the support 13 may be a rotary support spring or a ball and socket which can turn the light reflecting surface of the mirror body 12.

A description will now be given of a manufacturing method for the functional device according to the embodiment. FIG. 7 is a flowchart illustrating the manufacturing method for the functional device according to the embodiment, FIGS. 8A to 8G and 9A to 9C are step-by-step cross-sectional views illustrating the manufacturing method for the functional device according to the embodiment. In the manufacturing method for the functional device according to the embodiment, the mirror substrate 1 and the driver circuit substrate 2 are prepared separately and are connected together by the resin layer 3 to prepare a functional device.

Figure 8A:
FIGS. 8A through 8G are step-by-step cross-sectional views illustrating the manufacturing method for the functional device according to the embodiment.
Figure 8B:
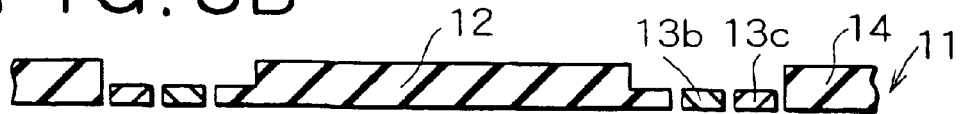

The method will be discussed in detail below. First, as shown in step S1 in FIG. 7 and FIG. 8A, a silicon substrate 11a is prepared. Next, the silicon substrate 11a is etched to form the mirror element 11 as shown in FIG. 8B. The mirror element 11 may be formed by a wafer process of processing a polysilicon thin film deposited on the silicon substrate by the silicon semiconductor processing technology.

Figure 8C:
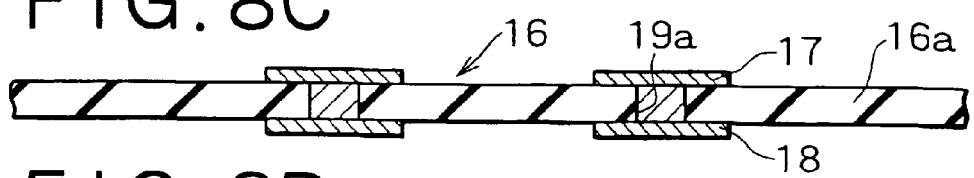

Next, as shown in step S2 in FIG. 7 and FIG. 8C, the drive electrodes 17 are formed on one side of a substrate 16a, the connecting electrodes 18 are formed on the other side and the through holes 19a which connect the drive electrodes 17 to the connecting electrodes 18 are formed in the substrate 16a. This provides the base substrate 16. The details of the method of forming the base substrate 16 shown in step S2 will be given later.

Figure 8D:
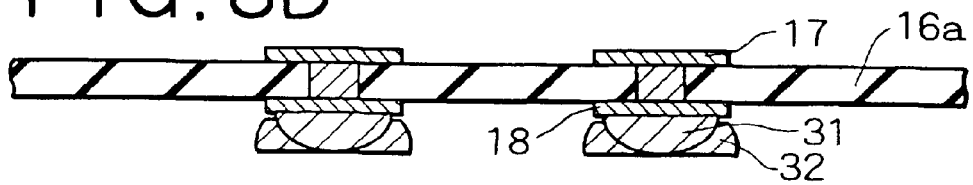

Then, as shown in step S3 in FIG. 7 and FIG. 8D, the connecting projections 31 formed by gold (Au) wires or the like are formed in such a way that their heights become even and the connection members 32 are applied around the connecting projections 31.

Figure 8E:
Figure 8F:

Next, as shown in step S4 in FIG. 7 and FIG. 8E, a plate 15a of an insulator, such as glass, is prepared. Then, as shown in FIG. 8F, the plate 15a is processed by laser processing or the like to form an opening 15b of a predetermined size. As a result, the supporting blocks 15 are prepared.

Figure 8G:
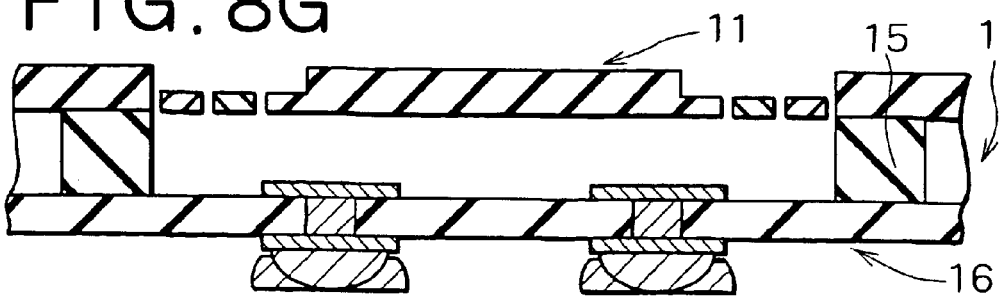

Net, as shown in step S5 in FIG. 7 and FIG. 8G, the mirror element 11 prepared in the process shown in step S1 and the base substrate 16 provided with through electrodes which has been prepared in the process shown in steps S2 and S3 are connected together via the supporting blocks 15 prepared in the process shown in step S4 by adhesion or electrostatic connection in such a way as to be located at predetermined positions, thereby forming the mirror substrate 1.

Figure 9A:
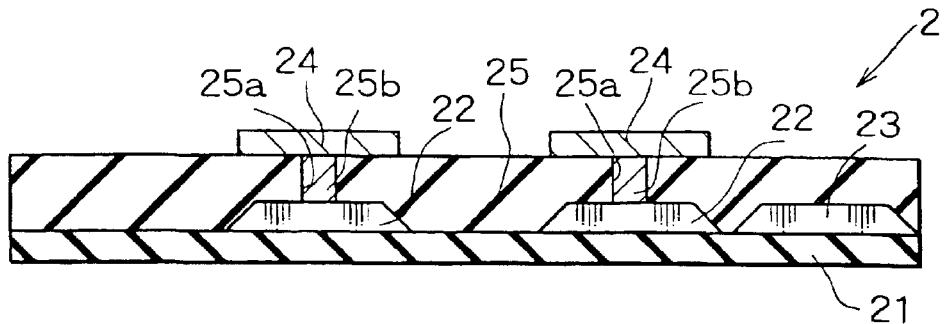
FIGS. 9A through 9C are step-by-step cross-sectional views, following the step of FIG. 8G, illustrating the manufacturing method for the functional device according to the embodiment.

Meanwhile, the driver circuit substrate 2 is prepared separately from the processes shown in steps S1 to S5, as shown in step S6 in FIG. 7 and FIG. 9A. That is, the element switch sections 22 constituted of a thin film semiconductor or the like and the driver circuit section 23 are formed on the substrate 21 of an insulator, such as glass, by the conventional thin film process. Then, the insulator layer 25 is formed in such a way as to cover the element switch sections 22 and the driver circuit section 23. Then, the contact holes 25a to be connected to the element switch sections 22 are formed in the insulator layer 25 and the conductor 25b are buried in the contact holes 25a. Thereafter, the surface electrodes 24 are formed on the top surface of the insulator layer 25 in such a way as to be connected to the contact holes 25a. This provides the driver circuit substrate 2.

Figure 9B:
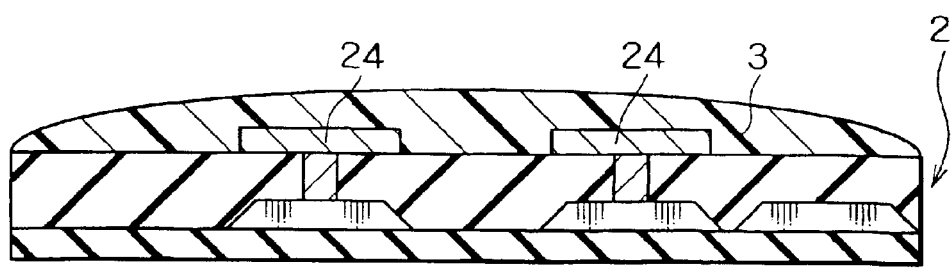
Figure 9C:
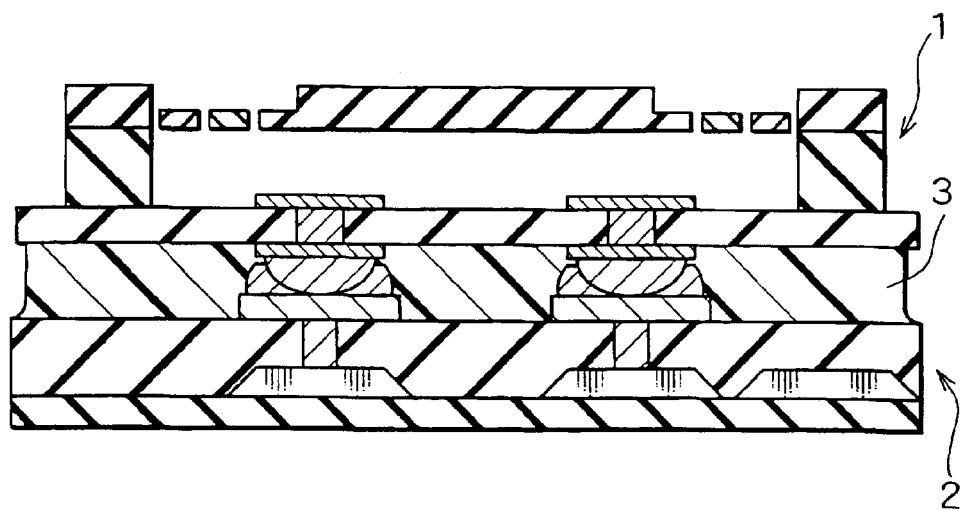

Next, as shown in step S7 in FIG. 7 and FIG. 9B, the resin layer 3 of a thermosetting adhesive or the like is applied onto that side of the driver circuit substrate 2 prepared in step S6 where the surface electrodes 24 are formed. Then, as shown in FIG. 9C, the mirror substrate 1 provided with the connecting projection 31 and connection members 32 and prepared in the process shown in step S5 and the driver circuit substrate 2 prepared in the process shown in step S6 are placed one on the other with alignment done in such a way that the connecting projections 31 abut on the surface electrodes 24, pressure is applied in the direction of making the mirror substrate 1 and the driver circuit substrate 2 come closer to each other and heating is applied to cure the resin layer 3, thereby connecting the mirror substrate 1 and the driver circuit substrate 2 together. This yields a functional device as shown in step S8 in FIG. 7.

Although the foregoing description of the embodiment has been given of the case where the process of forming the connecting projections (bumps) 31 (step S3) is carried out directly after the process of forming the through electrodes in the base substrate 16 (step S2), the former process may be carried out directly after the process of forming the mirror substrate 1 (step S5). The connecting projections 31 may be formed on the surface electrodes 24 of the driver circuit substrate 2. In this case, the process should be carried out immediately after the process of preparing the driver circuit substrate 2 (step S6) and the resin layer 3 should be applied onto that side where the connecting electrodes 18 are formed.

A detailed description will now be given of the method of forming the base substrate 16 shown in step S2 in FIG. 7. FIGS. 10A to 10D, 11A to 11D, 12A to 12C, 13A to 13D and 14A to 14C are step-by-step cross-sectional views illustrating how to form the base substrate 16. FIGS. 15A to 15D, 16A to 16D, 17A to 17C, 18A and 18B are step-by-step cross-sectional views illustrating how to form another base substrate 16.

Figure 10A:
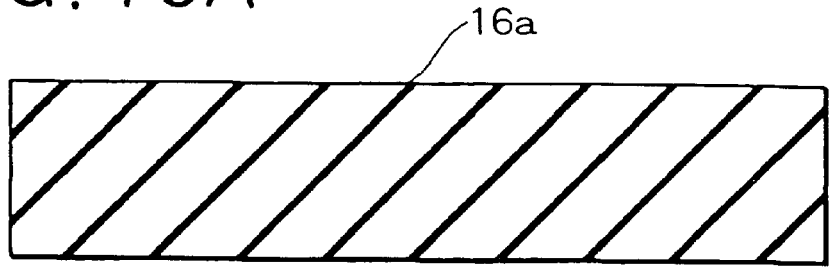
FIGS. 10A through 10D are step-by-step cross-sectional views illustrating how to form a base substrate 16 according to the embodiment.
Figure 10B:
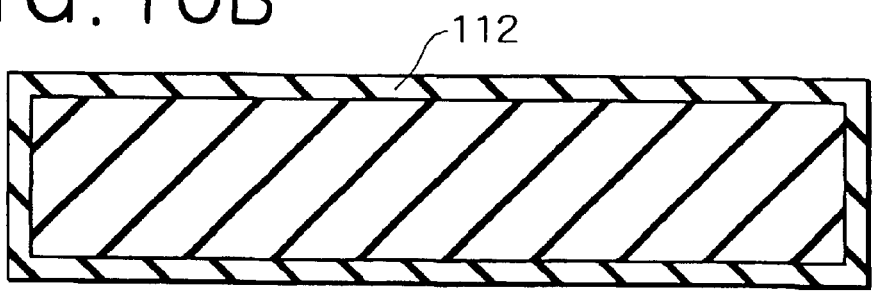
Figure 10C:
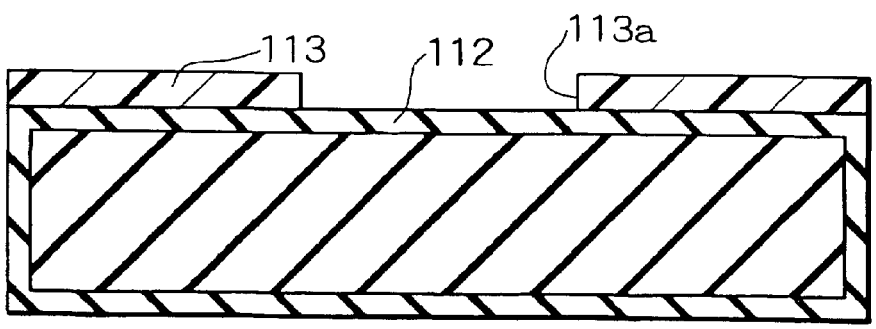
Figure 10D:
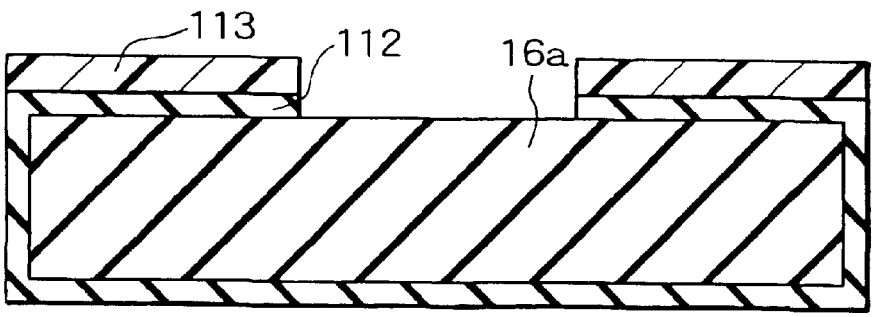

As shown in FIG. 10A, a silicon plate 16a of, for example, silicon is prepared. Then, as shown in FIG. 10B, the silicon plate 16a is thermally oxidized to form a silicon oxide layer 112 of, for example, 1 μm in thickness on the surface of the silicon plate 16a. Next, as shown in FIG. 10C, a photoresist mask 113 having an opening 113a is formed on the surface of the silicon plate 16a. Then, as shown in FIG. 10D, with the photoresist mask 113 used as a mask, reactive ion etching (RIE) is performed using $CHF_3$ and $CF_4$ to selectively remove the silicon oxide layer 112.

Figure 11A:
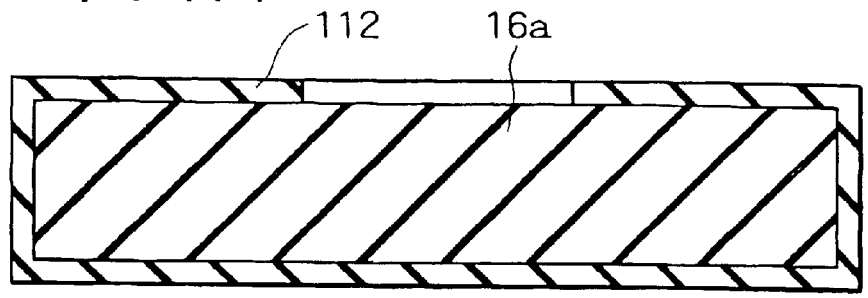
FIGS. 11A through 11D are step-by-step cross-sectional views, following the step of FIG. 10D, illustrating how to form the base substrate 16 according to the embodiment.
Figure 11B:
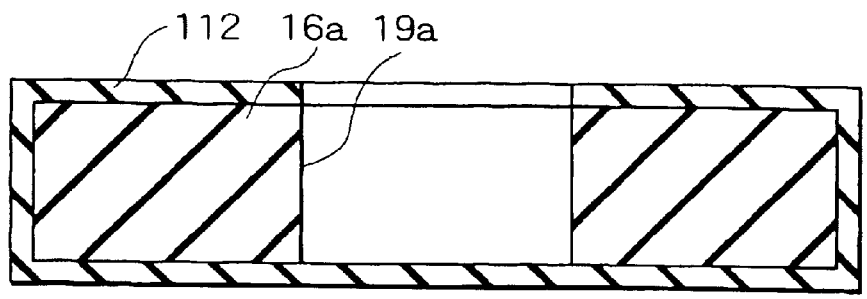
Figure 11C:
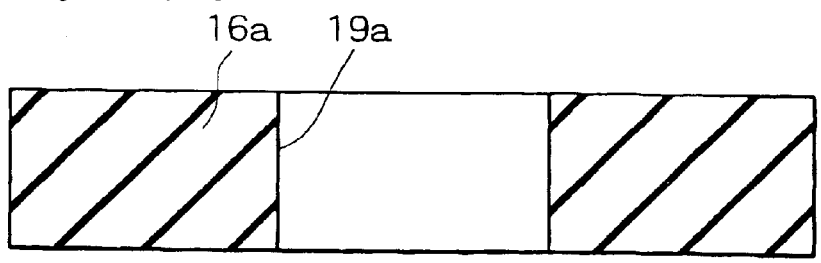
Figure 11D:
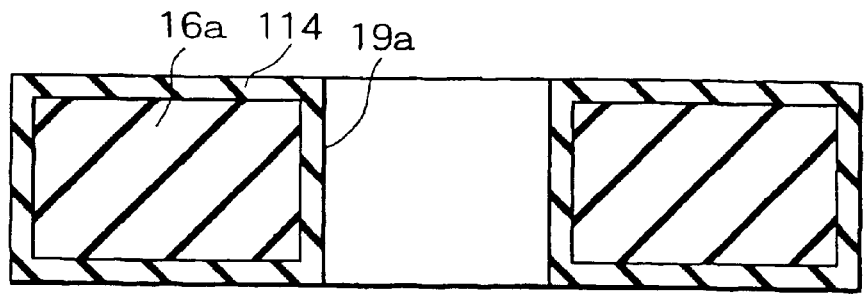

Next, as shown in FIG. 11A, the photoresist mask 113 is removed. Next, as shown in FIG. 11B, with the silicon oxide layer 112 used as a mask, RIE is performed using $SF_6$ and $CF_4$ to selectively etch out the silicon plate 16a, thereby forming the through hole 19a. Next, as shown in FIG. 11C, the silicon oxide layer 112 is removed by HF (hydrofluoric acid). Then, as shown in FIG. 11D, an insulating layer 114 of silicon nitride is formed on the surface of the silicon plate 16a by CVD.

Figure 12A:
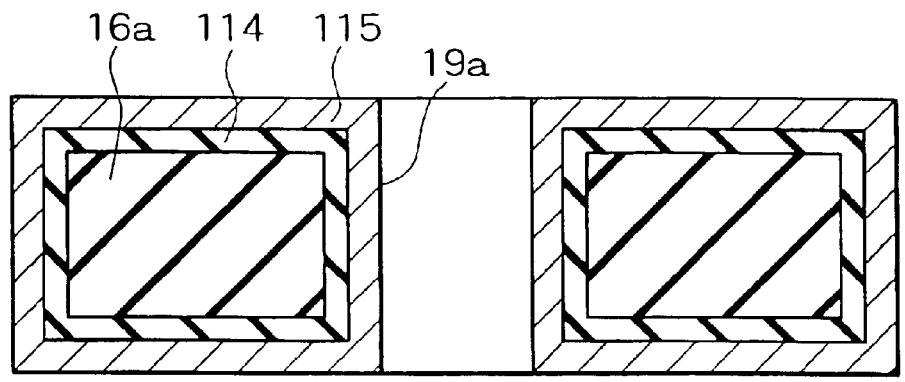
FIGS. 12A through 12C are step-by-step cross-sectional views, following the step of FIG. 11D, illustrating how to form the base substrate 16 according to the embodiment.
Figure 12B:
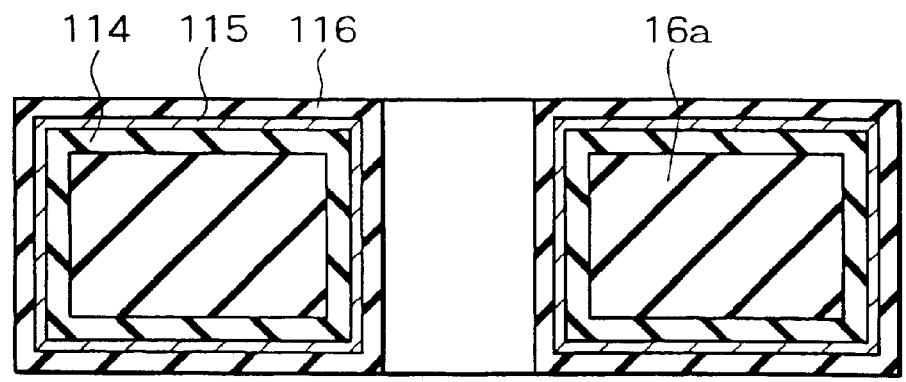
Figure 12C:
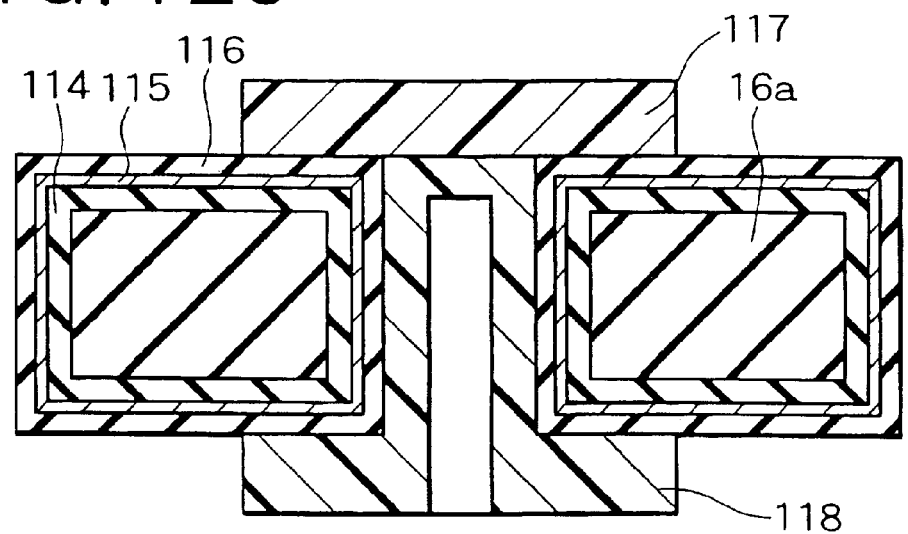

Next, as shown in FIG. 12A, a polysilicon layer 115 is formed by CVD so as to cover the insulating layer 114. The thickness of the polysilicon layer 115 is determined in consideration of the resistance of the through hole portions obtained and the load of the process and is set to, for example, 0.5 to 10 μm, preferably 1 to 5 μm. Next, as shown in FIG. 12B, the surface layer of the polysilicon layer 115 is thermally oxidized to form a silicon oxide layer 116 of, for example, 0.2 to 2 μm in thickness. Then, as shown in FIG. 12C, a photoresist mask 117 is formed on one side of the silicon plate 16a and a photoresist mask 118 is formed on the other side and inside the through hole 19a. A sheet resist is used for the photoresist mask 117 and a spin-coated photoresist is used for the photoresist mask 118.

Figure 13A:
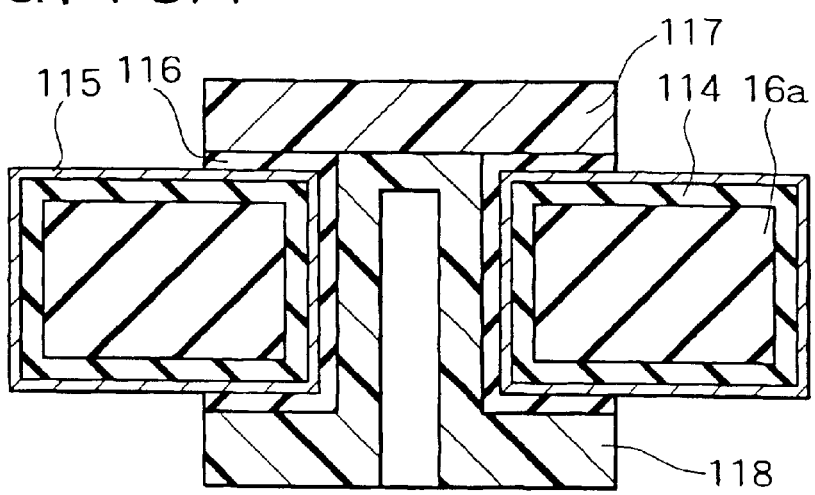
FIGS. 13A through 13C are step-by-step cross-sectional views, following the step of FIG. 12C, illustrating how to form the base substrate 16 according to the embodiment.
Figure 13B:
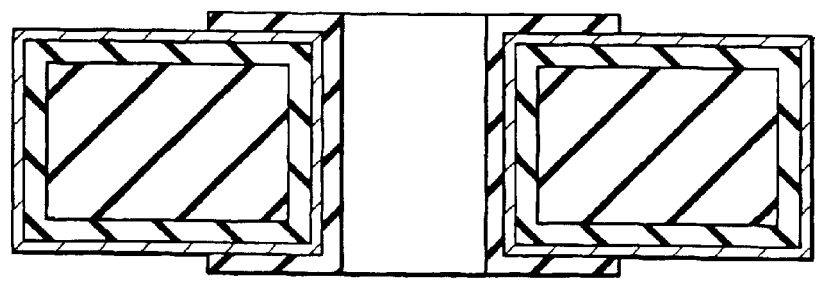
Figure 13C:
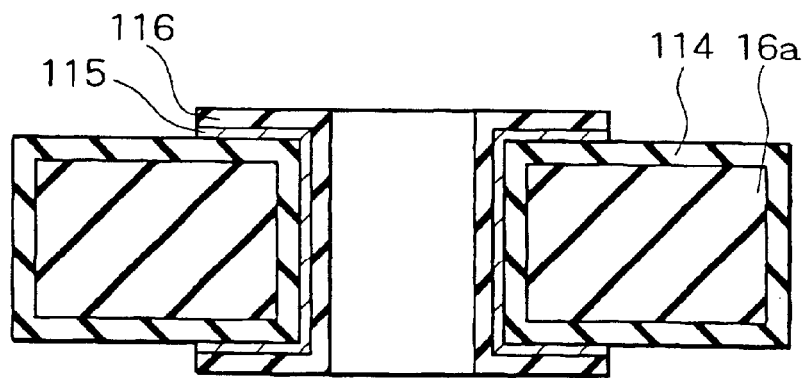

Next, as shown in FIG. 13A, with the photoresist masks 117 and 118 used as masks, RIE is performed using $CHF_3$ and $CF_4$ to selectively etch out the silicon oxide layer 116. Next, as shown in FIG. 13B, the photoresist masks 117 and 118 are removed. Then, as shown in FIG. 13C, with the silicon oxide layer 116 used as a mask, RIE is performed using $SF_6$ to selectively etch out the silicon oxide layer 115.

Figure 14A:
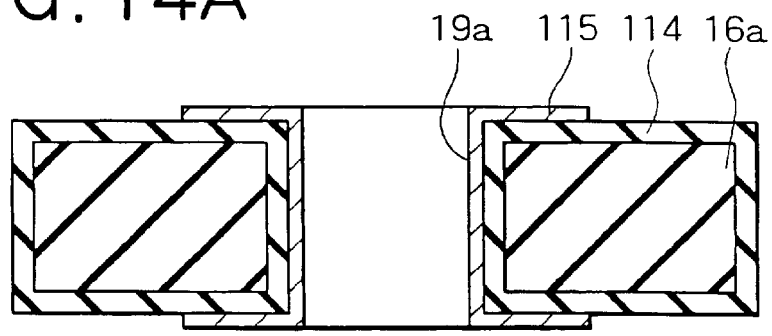
FIGS. 14A through 14C are step-by-step cross-sectional views, following the step of FIG. 13D, illustrating how to form the base substrate 16 according to the embodiment.
Figure 14B:
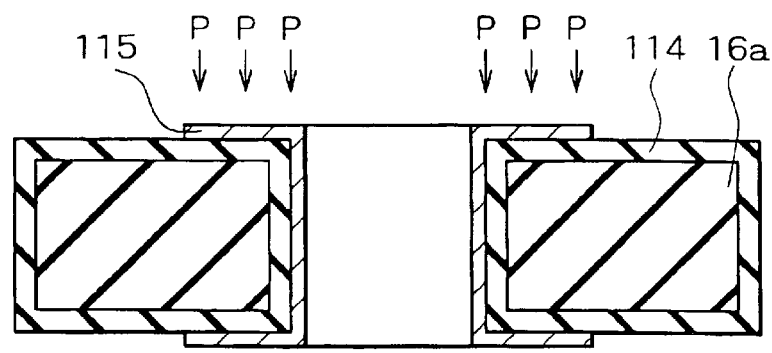
Figure 14C:
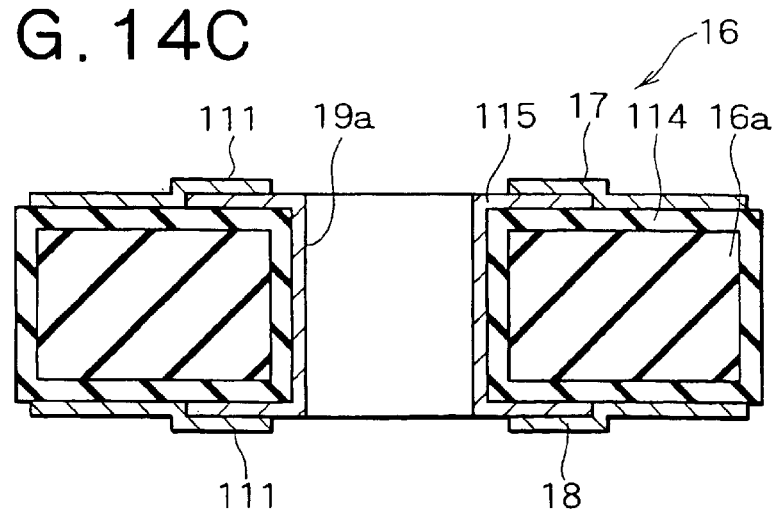

Next, as shown in FIG. 14A, the silicon oxide layer 116 is removed by HF (hydrofluoric acid), thus leaving the polysilicon layer 115 with a thickness of, for example, 0.3 to 8 μm, more adequately 1 to 4 μm. Next, as shown in FIG. 14B, the polysilicon layer 115 is doped with phosphorus (P). As a result, the polysilicon layer 115 becomes an N type and the resistance becomes lower. Because phosphorus (P) is not diffused in the insulating layer 14 of silicon nitride at this time, the insulating property of the insulating layer 114 is maintained. Next, as shown in FIG. 14C, an interconnection pattern 111 of gold (Au) which will become the drive electrode 17 and the connecting electrode 18 is formed. As the conductive polysilicon layer 115 is formed on the side wall of the through hole 19a this way, the drive electrode 17 and the connecting electrode 18 are connected together. Accordingly, the base substrate 16 is prepared.

Figure 15A:
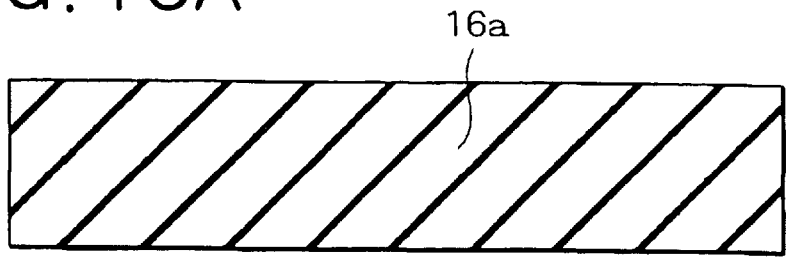
FIGS. 15A through 15D are step-by-step cross-sectional views illustrating how to form another base substrate 16 according to the embodiment.
Figure 15B:
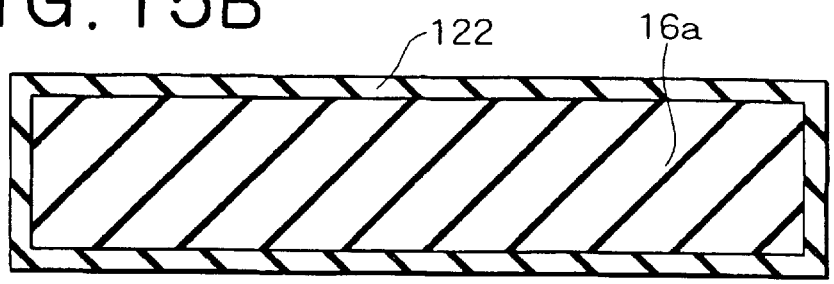
Figure 15C:
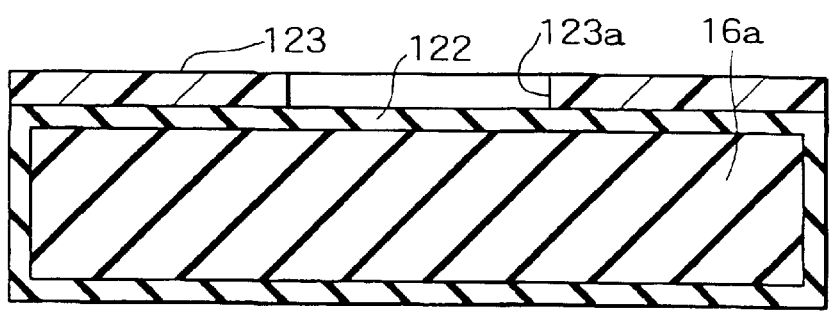
Figure 15D:
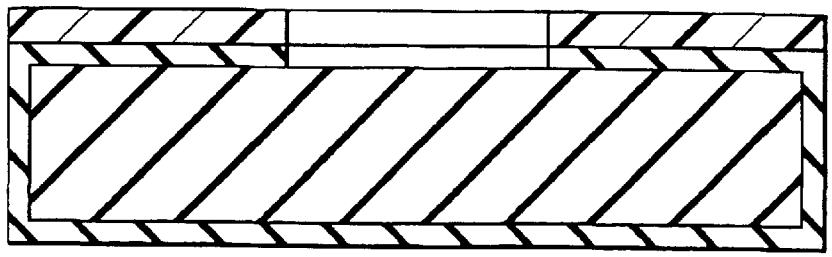

The base substrate 16 equipped with the through electrodes comprised of the drive electrodes 17 and connecting electrodes 18 can be prepared by another method as illustrated in FIGS. 15A to 15D, 16A to 16D, 17A to 17C, 18A and 18B. First, the silicon plate 16a of, for example, silicon is prepared. Then, as shown in FIG. 15B, the silicon plate 16a is thermally oxidized to form the silicon oxide layer 122 of, for example, 1 μm in thickness on the surface of the silicon plate 16a. Next, as shown in FIG. 15C, a photoresist mask 123 having an opening 123a is formed on the surface of the silicon plate 16a. Then, as shown in FIG. 15D, with the photoresist mask 123 used as a mask, RIE is performed using $CHF_3$ and $CF_4$ to selectively etch out the silicon oxide layer 122.

Figure 16A:
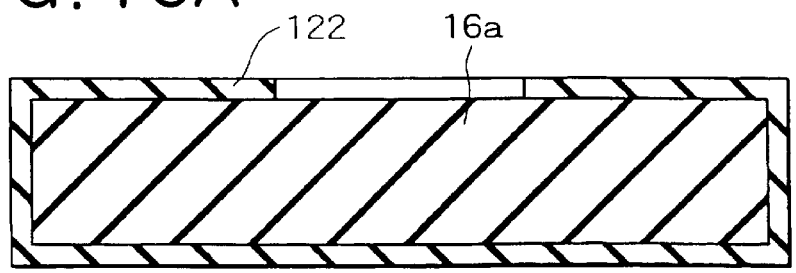
FIGS. 16A through 16D are step-by-step cross-sectional views, following the step of FIG. 15D, illustrating how to form the base substrate 16.
Figure 16B:
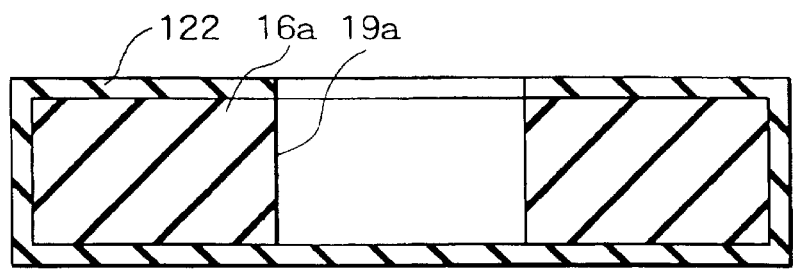
Figure 16C:
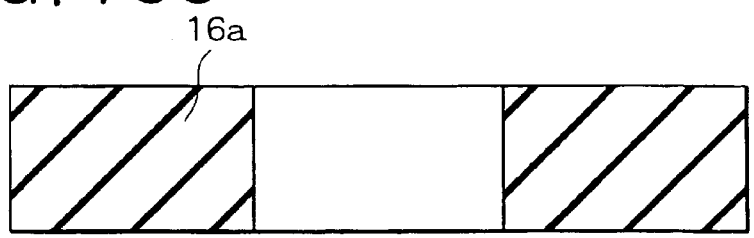
Figure 16D:
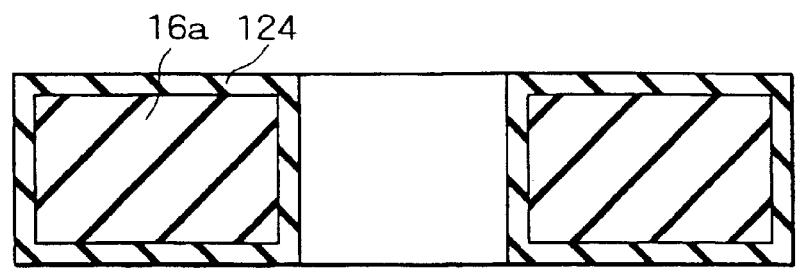

Next, as shown in FIG. 16A, the photoresist mask 123 is removed. Next, as shown in FIG. 16B, with the silicon oxide layer 122 used as a mask, RIE is performed using $SF_6$ and $CF_4$ to selectively etch out the silicon plate 16a, thereby forming the through hole 19a. Then, as shown in FIG. 16C, the silicon oxide layer 122 is removed by HF (hydrofluoric acid). Then, as shown in FIG. 16D, an insulating layer 124 of silicon nitride is formed on the surface of the silicon plate 16a by CVD.

Figure 17A:
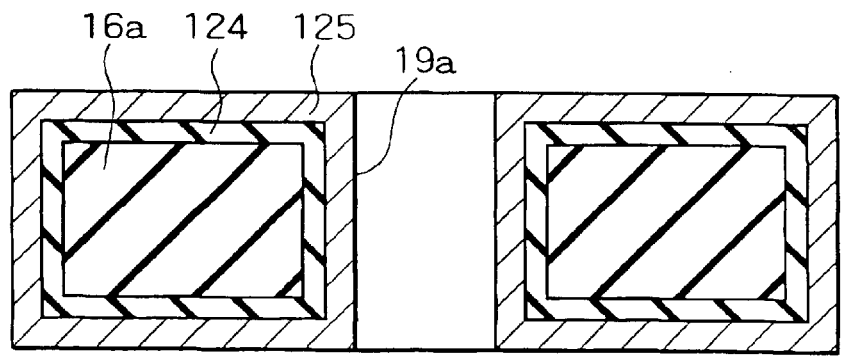
FIGS. 17A through 17C are step-by-step cross-sectional views, following the step of FIG. 16D, illustrating how to form the base substrate 16.
Figure 17B:
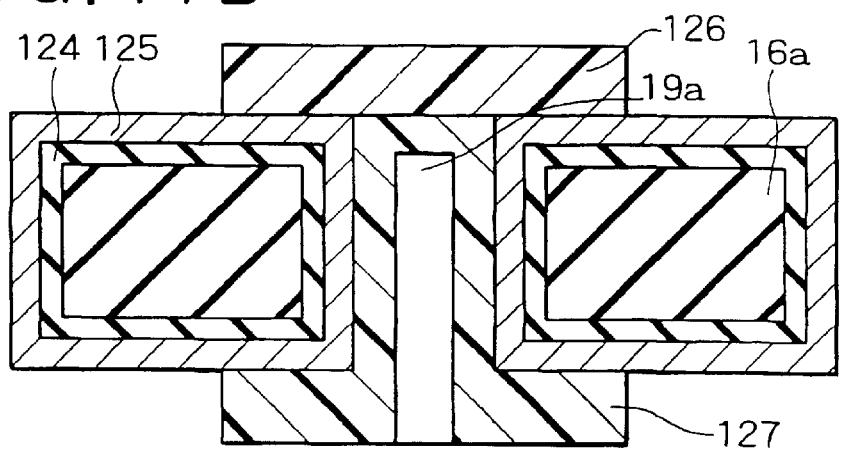
Figure 17C:
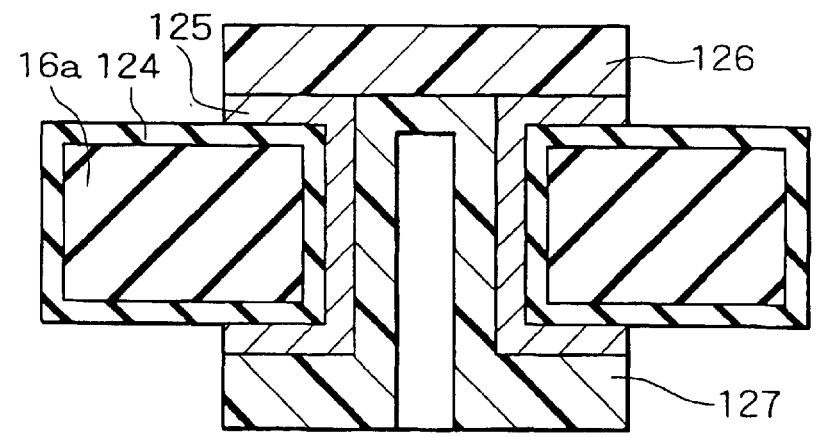

Next, as shown in FIG. 17A, a copper (Cu) layer 125 is formed to a thickness of, for example, 0.5 to 10 μm by electroless plating. Next, as shown in FIG. 17B, a photoresist mask 126 is formed on the surface of the silicon plate 16a and a photoresist mask 127 is on bottom side of the silicon plate 16a and inside the through hole 19a. A sheet resist is used for the photoresist mask 126 and a spin-coated photoresist is used for the photoresist mask 127. Next, as shown in FIG. 17C, with the photoresist masks 126 and 127 used as masks, the copper layer 125 is selectively etched out by chemical etching.

Figure 18A:
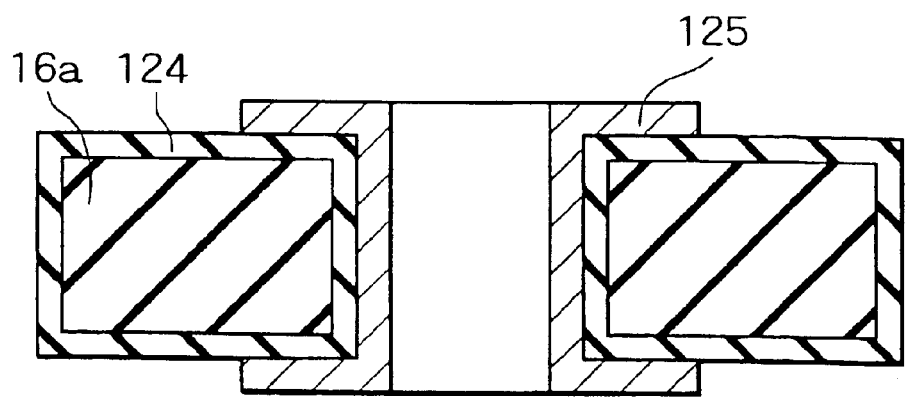
FIGS. 18A and 18B are step-by-step cross-sectional views, following the step of FIG. 17C, illustrating how to form the base substrate 16.
Figure 18B:
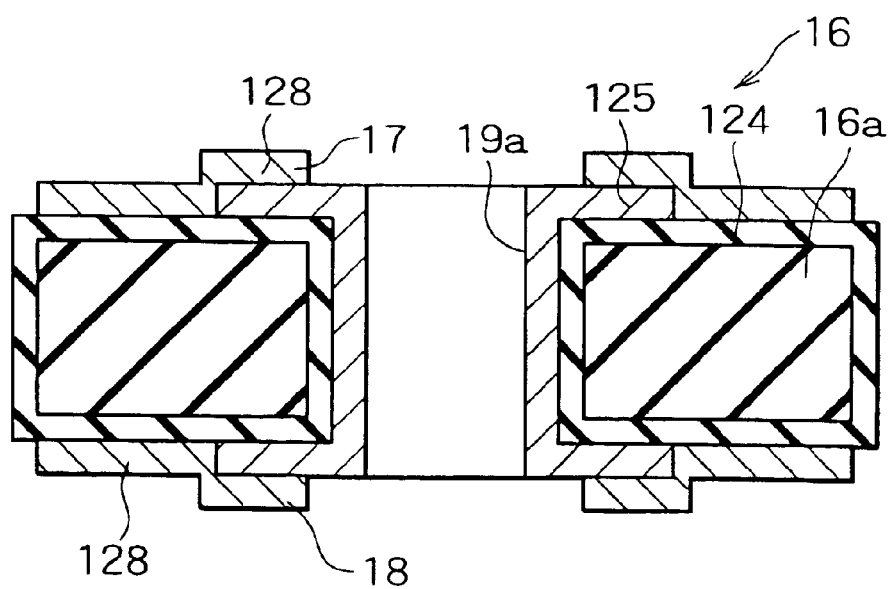

Thereafter, as shown in FIG. 18A, the photoresist masks 126 and 127 are removed. Then, as shown in FIG. 18B, an interconnection pattern 128 of gold (Au) which will become the drive electrode 17 and the connecting electrode 18 is formed. As the electroless copper layer 125 is formed on the side wall of the through hole 19a this way, the electrical connection between the drive electrode 17 and the connecting electrode 18 is secured. Accordingly, the base substrate 16 is prepared.

According to the embodiment, a plurality of TFTs are formed on the substrate that has an insulating surface and the mirror substrate 1 having the mirror elements 11 is laminated on the driver circuit substrate 2 having the switch circuits, driver circuits, logic circuits and so forth constructed in a monolithic form while keeping the electrical connection between the mirror substrate 1 and the driver circuit substrate 2. This structure can make the interconnections which supply drive and control signals to the mirror elements 11 as fewer as possible, as compared with the case where the mirror substrate and the driver circuit substrate are prepared separately and are interconnected by a flexible substrate or the like. In case of an m×n array of optical switches, for example, the prior arts require at least (4×m× n+1) interconnections to an external unit including the ground interconnection. According to the embodiment, by way of contrast, even in case where applied voltage generating sections equal in number to the number of channels equivalent to n columns (i.e., 4n channels) are provided, the number of interconnections can be reduced a minimum of (4×n+m+1). This can contribute to the reduction in the area for the layout of the interconnections, scale reduction, the miniaturization of the functional device and an improvement of the reliability thereof. Further, it is possible to drive all the mirror elements with a single driver circuit section, without providing the same number of driver circuit sections as the mirror elements. Even in case where the number of mirror elements is increased due to the multi-channel design and large scale design of optical switches, therefore, the circuit section is not enlarged, thus making it possible to suppress the enlargement of the optical device.

Further, the formation of a plurality of TFTs on the substrate that has an insulating surface can allow an optical device to be prepared at a low cost. Furthermore, because the optical switch is constructed by preparing the mirror substrate and e driver circuit substrate in separate processes and laminating the substrates one on the other, it is possible to optimize the processes of preparing the substrates and the characteristics of both substrates.

Japanese Patent Laid-Open No. 2002-189178, which was laid open later than the filing date of the application on which the priority of the present invention was based, describes a technique of forming an MEMS element drive circuit, an insulating layer and MEMS elements on a semiconductor substrate in a monolithic fashion. The technique described in the Japanese Patent Laid-Open No. 2002-189178, however, cannot evaluate the characteristics of the MEMS element drive circuit and MEMS elements independently during manufacture and it is merely possible, at the last stage of the manufacture process, to determine whether or not the devices as a whole is satisfactory. This leads to a lower yield of the devices. According to the embodiment, by way of contrast, as the mirror substrate and the driver circuit substrate are prepared in separate processes, the mirror substrate and the driver circuit substrate can be evaluated independently during fabrication and it is possible to optimize the processes of preparing both substrates and the characteristics thereof. This is advantageous in yield.

Figure 19:
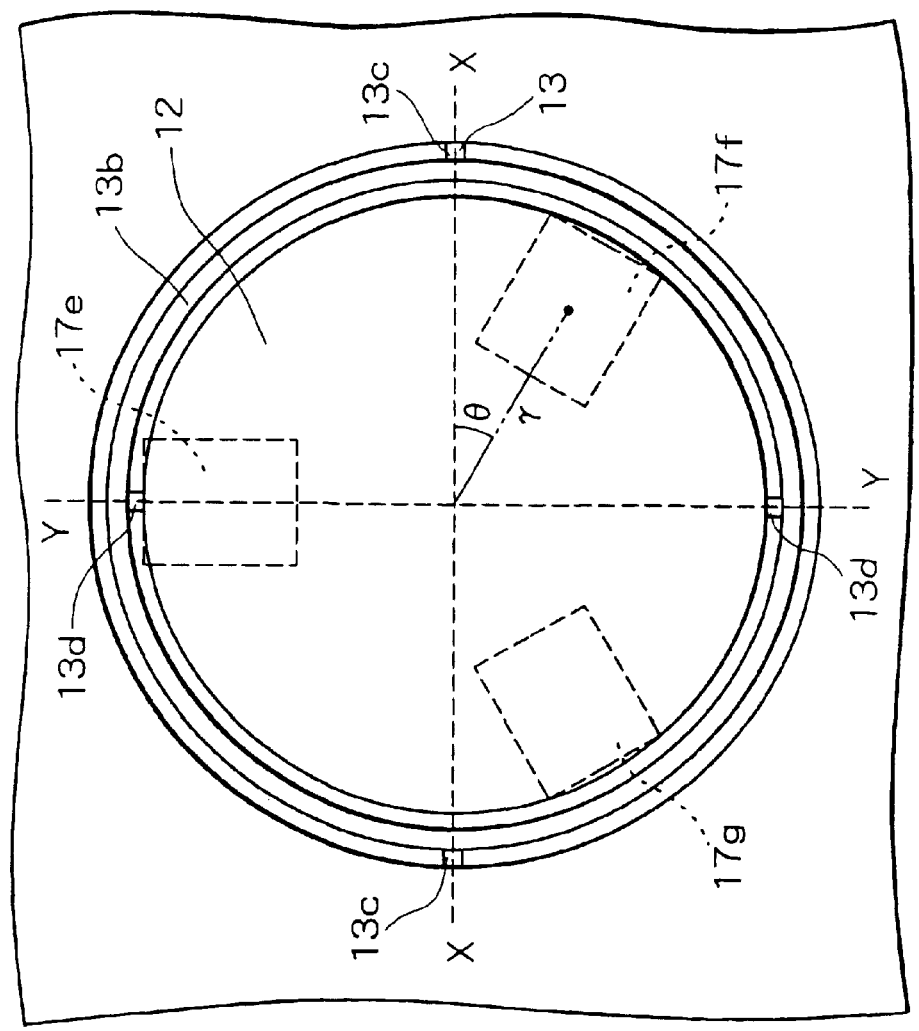
FIG. 19 is a plan view showing a mirror element according to a modification of the embodiment.

A modification of the embodiment will now be discussed. FIG. 19 is a plan view showing a mirror element according to the modification. The foregoing description of the embodiment has been given of the case where the four drive electrodes 17a to 17d are arranged quadruple quadrisymmetrical to one another with respect to the center axis of the mirror body 12. In the modification, three drive electrodes 17e, 17f and 17g are arranged tri-symmetrical to one another with respect to the mirror body 12, as shown in FIG. 19. In the functional device of the modification, switch element sections 22 equal in number to the drive electrodes 17 are provided. The drive electrodes 17e to 17g are respectively connected to the switch element sections 22 so that predetermined voltages are applied to the respective drive electrodes. The other structure of the modification is the same as that of the first embodiment.

Because the mirror body 12 is grounded in the modification as in the first embodiment, electrostatic force is generated between the drive electrodes 17e to 17g and the mirror body 12 in accordance with the voltages applied to the drive electrodes 17e to 17g. When a voltage is applied to the drive electrode 17e or the equal voltage is applied to the drive electrodes 17f and 17g, electrostatic force is generated between the voltage-applied drive electrode and the mirror body 12, causing the mirror body 12 to turn about the rotational axis extending in the X direction. That is, the mirror body 12 rotates together with the ring 13b with the shaft members 13c as the rotational axis. When voltages are applied to the drive electrodes 17e and 17f or voltages are applied to the drive electrodes 17e and 17g, on the other hand, the mirror body 12 turns with respect to the ring 13b with the shaft members 13d as the rotational axis. The reason for the application of the voltage to the drive electrode 17e is to cancel out the rotational axis component in the X direction of the rotational torque generated by the electrostatic force, which is needed because the drive electrodes 17f and 17g are shifted from the X axis. The amount of the shift, L, of the drive electrodes 17f and 17g from the X axis is given by $L = r \times \sin\theta$ where r is the distance from the intersection of the X axis and the Y axis to the center of the drive electrodes and $\theta$ is an angle formed by a line connecting the intersection and the center and the X axis ($\theta = 30°$ in the tri-symmetrical case).

Because the mirror body 12 has rotational axes perpendicular to each other and three drive electrodes 17 are provided at tri-symmetrical positions with respect to the center axis of the mirror body 12 in the modification, the mirror body 12 can be inclined in an arbitrary direction by applying a voltage to one or two of the three drive electrodes 17e, 17f and 17g. The modification can reduce the number of the drive electrodes 17 and the number of the switch element sections 22 as compared with the first embodiment.

With the same thought applied to the case where the number of drive electrodes is five or greater, the mirror body 12 can be tilted in an arbitrary direction by breaking down the electrostatic force generated by each drive electrode into individual rotational axial components and controlling those components. In this manner, the mirror body 12 can be directed in an arbitrary direction to reflect the input light in the arbitrary direction.

Figure 20:
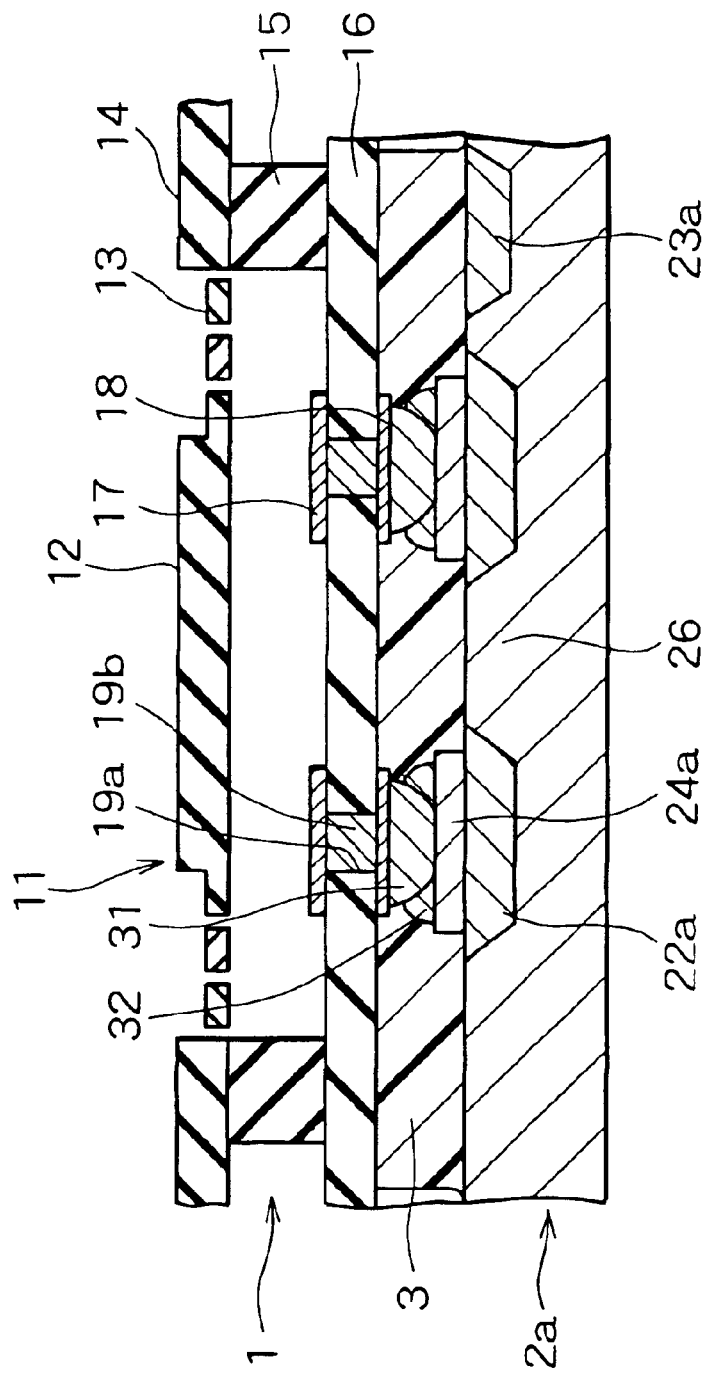
FIG. 20 is a partly cross-sectional view showing a functional device according to a second embodiment of the invention and showing a cross section passing the X—X axis of a mirror element 11 and perpendicular to the surface of a mirror frame 14.

The second embodiment of the invention will be discussed below. FIG. 20 is a partly cross-sectional view showing a functional device according to the embodiment and showing the cross section passing the X—X axis (see FIG. 2) of a mirror element 11 and perpendicular to the surface of a mirror frame 14. The functional device of the embodiment, like the functional device according to the first embodiment, is an optical switch which uses a light reflecting mirror and uses electrostatic force as the drive force to drive the light reflecting mirror. It is to be noted however that unlike the functional device of the first embodiment which has the driver circuit prepared by forming a plurality of TFTs on the substrate 21 having an insulating surface, the functional device according to this embodiment uses a circuit substrate which has a driver circuit prepared on the surface of a semiconductor substrate of silicon or the like.

As shown in FIG. 20, the functional device according to the embodiment comprises a mirror substrate 1 and driver circuit substrate 2a. In the driver circuit substrate 2a, unlike the driver circuit substrate 2 of the first embodiment, element switch sections 22a each constituted by a transistor manufactured by the thin film process are provided on the surface of a semiconductor substrate 26 of silicon or the like. The element switch sections 22a provided are equal in number to the drive electrodes 17, and a driver circuit section 23a which selectively drives the element switch sections 22a is provided on the substrate 26 as per the first embodiment. An oxide film (not shown) is provided on the element switch sections 22a and the driver circuit section 23a. Surface electrodes 24a are provided on the element switch sections 22a. Note that a part of the oxide film is removed so that the element switch sections 22a are connected to the respective surface electrodes 24a. The surface electrodes 24a are provided at positions corresponding to the connecting electrodes 18 of the mirror substrate 1. As in the first embodiment, the surface electrodes 24a and the connecting electrodes 18 can be laid out at arbitrary positions on the oxide film (not shown) and the base substrate 16 within the range where the electrical connection between the drive electrodes 17 and the element switch sections 22a is secured.

The structure of the mirror substrate 1 in the second embodiment is the same as the structure of the mirror substrate 1 (see FIG. 2) in the first embodiment. The other structure of the functional device according to the embodiment is the same as that of the functional device according to the first embodiment.

The operation of the functional device according to the embodiment will be discussed below. The voltage that has been generated in the element switch section 22a is applied to the surface electrode 24a. Because the surface electrode 24a is connected to the associated drive electrode 17 via the associated connecting electrode 18 as per the first embodiment, electrostatic force is generated between the drive electrode 17 and the mirror body 12, thereby controlling the direction of the mirror body 12. The other portions of the operation of the functional device according to the embodiment are the same as those of the operation of the functional device according to the first embodiment.

In addition to the advantages of the first embodiment, the second embodiment has an advantage such that because the driver circuit is prepared on the surface of the semiconductor substrate of silicon or the like, fast and high-voltage element switch sections and driver circuit section can be acquired. Because existing logic circuits and operation circuits or the like can be included, the driver circuit can have higher functionality and higher performance.

As described in the aforementioned Japanese Patent Laid-Open No. 2002-189178, while the driver circuit may be formed on the semiconductor substrate and MEMS elements, such as mirror elements, may be formed in a monolithic fashion on the driver circuit, this method cannot permit the evaluation of the characteristics of the driver circuit and MEMS elements during manufacturing and it is not possible to determine whether or not the device is satisfactory until the last stage of the manufacturing process. According to the embodiment, by way of contrast, mirror substrate and the driver circuit substrate can be prepared separately, those substrates can be evaluated independently. Therefore, the overall yield of functional devices becomes high.

Figure 21:
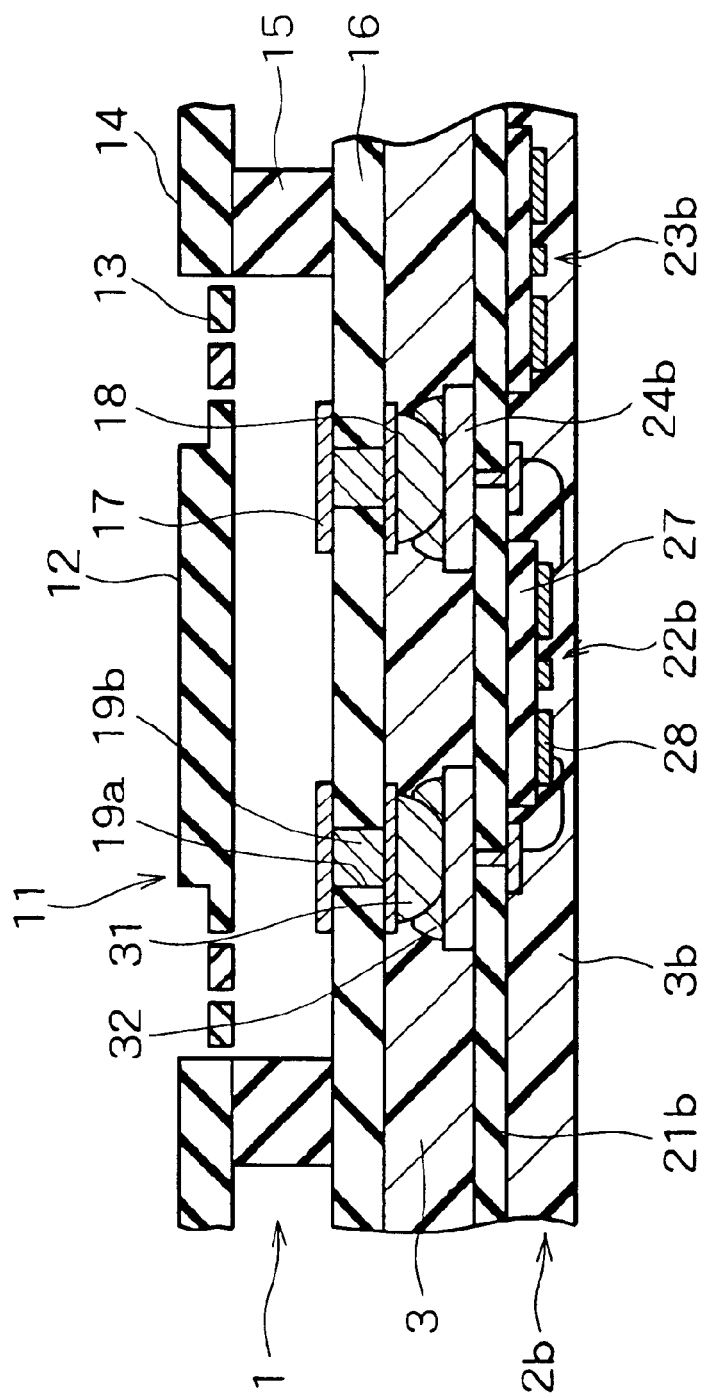
FIG. 21 is a partly cross-sectional view showing a functional device according to a third embodiment of the invention and showing a cross section passing the X—X axis of a mirror element 11 and perpendicular to the surface of a mirror frame 14.

The third embodiment of the invention will be discussed below. FIG. 21 is a partly cross-sectional view showing a functional device according to the embodiment and showing the cross section passing the X—X axis (see FIG. 2) of a mirror element 11 and perpendicular to the surface of a mirror frame 14. The functional device of the embodiment, like the functional device according to the first embodiment, is an optical switch which uses a light reflecting mirror and uses electrostatic force as the drive force to drive the light reflecting mirror. It is to be noted however that unlike the functional device of the first embodiment which has the driver circuit prepared by forming a plurality of TFTs on the substrate 21 having an insulating surface, the functional device according to this embodiment uses a circuit substrate which has a driver circuit prepared by providing a plurality of semiconductor chips, passive elements, etc. on an insulating substrate, interconnecting those components and then molding the resultant structure.

As shown in FIG. 21, the functional device according to the embodiment comprises a mirror substrate 1 and driver circuit substrate 2b. The driver circuit substrate 2b differs from the driver circuit substrate 2 of the first embodiment in the structures of the element switch sections and the driver circuit section. According to the embodiment, a single or a plurality of circuit chips 28, such as semiconductor integrated circuits and passive circuit parts, are mounted on an insulating substrate 27 of ceramics, epoxy or the like, thus constituting an element switch section 22b. While the same number of element switch sections 22b as the drive electrodes 17 are provided, a plurality of element switch sections 22b may be provided on a single insulating substrate 27. The insulating substrate 27 is held on a base substrate 21b and is molded by an insulating resin layer 3b. Through electrodes similar to those of the first embodiment are provided on the base substrate 21b and surface electrodes 24b are formed thereon, so that the element switch sections 22b on the insulating substrate 27 are connected to the surface electrodes 24b by wire bonding or the like.

As in the first embodiment, the surface electrodes 24b and the connecting electrodes 18 can be laid out at arbitrary positions on the base substrate 21b and the base substrate 16 within the range where the electrical connection between the drive electrodes 17 and the element switch sections 22b is secured. A driver circuit section 23b which selectively drives the element switch sections 22b is provided on the substrate 21b as per the first embodiment.

The structure of the mirror substrate 1 in the third embodiment is the same as the structure of the mirror substrate 1 (see FIG. 2) in the first embodiment. The other structure of the functional device according to the embodiment is the same as that of the functional device according to the first embodiment.

The operation of the functional device according to the embodiment will be discussed below. The voltage that has been generated in the element switch section 22b is applied to the surface electrode 24b via the through electrode. Because the surface electrode 24a is connected to the associated drive electrode 17 via the associated connecting electrode 18 as per the first embodiment, electrostatic force is generated between the drive electrode 17 and the mirror body 12, thereby controlling the direction of the mirror body 12. The other portions of the operation of the optical device according to the embodiment are the same as those of the operation of the functional device according to the first embodiment.

In addition to the advantages of the first embodiment, the third embodiment has an advantage such that because the driver circuit is prepared by a plurality of circuit chips, high-voltage element switch sections and driver circuit section can be acquired. Further, a complicated thin film process need not be used in preparing the driver circuit, which would bring about an advantage of reducing the cost of the driver circuit.

Figure 22:
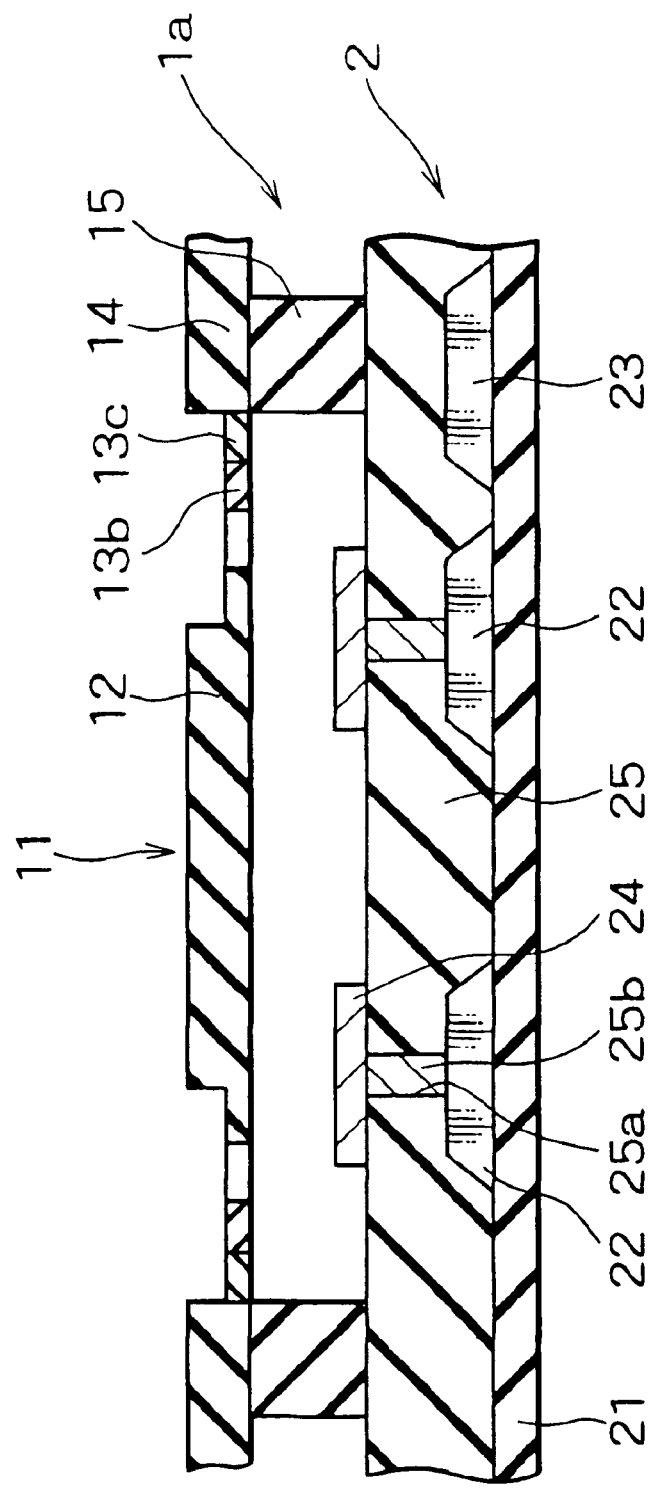
FIG. 22 is a partly cross-sectional view showing a functional device according to a fourth embodiment of the invention and showing a cross section passing the X—X axis of a mirror element 11 and perpendicular to the surface of a mirror frame 14.

The fourth embodiment of the invention will be discussed below. FIG. 22 is a partly cross-sectional view showing the structure of a functional device according to the embodiment and showing the cross section passing the X—X axis (see FIG. 2) of a mirror element 11 and perpendicular to the surface of a mirror frame 14. The functional device of the embodiment, like the functional device according to the first embodiment, is an optical switch which uses a light reflecting mirror and uses electrostatic force as the drive force to drive the light reflecting mirror. It is to be noted however that unlike the functional device of the first embodiment in which the electrical connection between the connecting electrodes 18 formed on the bottom side of the base substrate 16 and the surface electrodes 24 of the driver circuit substrate 2 is secured by the connecting projections 31 and the connection members 32, the surface electrodes 24 of the driver circuit substrate 2 are drive electrodes for the mirror elements 11.

As shown in FIG. 22, the functional device according to the embodiment comprises a mirror substrate 1a and driver circuit substrate 2. The mirror substrate 1a differs from the mirror substrate 1 of the first embodiment (see FIG. 2) in that the drive electrodes 17, the base substrate 16, the connecting electrodes 18 and the connecting projections 31 are eliminated. The functional device according to the fourth embodiment differs from the functional device according to the first embodiment in that the resin layer 3 and the connection members 32 are omitted. The structure of the driver circuit substrate 2 of the embodiment is the same as the structure of the driver circuit substrate 2 of the first embodiment (see FIG. 2). The other structure of the functional device according to the embodiment is the same as that of the functional device according to the first embodiment.

The operation of the functional device according to the embodiment will be discussed below. The voltage that has been generated in the element switch section 22 is applied to the surface electrode 24 via the conductor 25b in the contact hole 25a. Electrostatic force is generated between the surface electrode 24 and the mirror body 12 to thereby control the direction of the mirror body 12. That is, the surface electrodes 24 in the embodiment serve as the drive electrodes 17 in the first embodiment. The other portions of the operation of the functional device according to the embodiment are the same as those of the operation of the functional device according to the first embodiment.

In addition to the advantages of the first embodiment, the fourth embodiment has an advantage such that the drive electrodes 17, the base substrate 16, the connecting electrodes 18, the connecting projections 31, the resin layer 3 and the connection members 32 can be eliminated. This can simplify the structure of the optical device and reduce the production cost. It is also possible to eliminate the processes, such as the formation of the connecting projections 31 on the connecting electrodes 18 to secure the electrical connection between the electrodes and the positioning of the connecting electrodes 18 with the surface electrodes 24, thus leading to further cost reduction.

Figure 23:
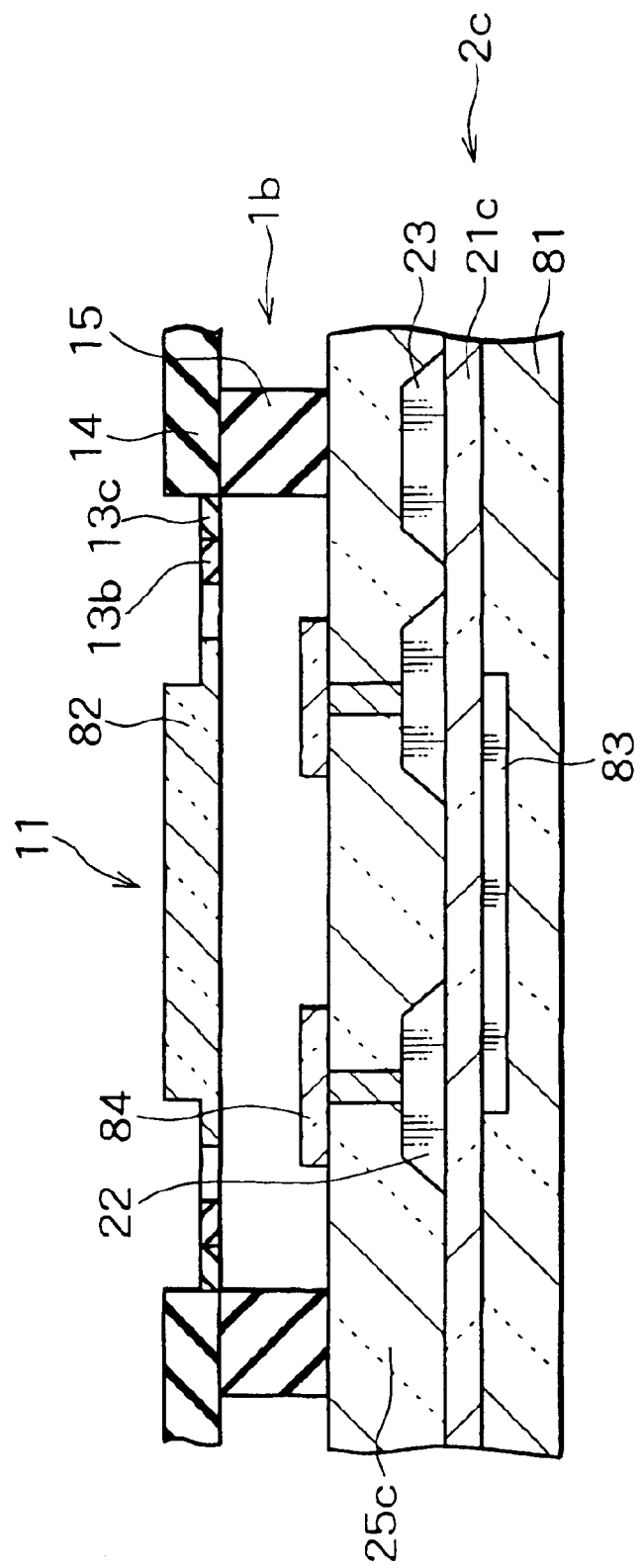
FIG. 23 is a partly cross-sectional view showing a functional device according to a fifth embodiment of the invention and showing a cross section passing the X—X axis of a mirror element 11 and perpendicular to the surface of a mirror frame 14.

The fifth embodiment of the invention will be discussed below. FIG. 23 is a partly cross-sectional view showing the structure of a functional device according to the embodiment and showing the cross section passing the X—X axis (see FIG. 2) of a mirror element 11 and perpendicular to the surface of a mirror frame 14. The functional device of the embodiment, like the functional devices according to the first to fourth embodiments, is an optical switch which uses a light reflecting mirror and uses electrostatic force as the drive force to drive the light reflecting mirror.

As shown in FIG. 23, the functional device according to the embodiment comprises a mirror substrate 1b and driver circuit substrate 2. The mirror substrate 1b differs from the mirror substrate 1a of the fourth embodiment (see FIG. 22) in that the mirror body 12 is replaced with a semitransparent mirror body 82. That is, the mirror body 82 reflects part of input light and directly passes the remaining part of the light. A thin coat formed on a transparent substrate, for example, is used for the mirror body 82.

The driver circuit substrate 2c differs from the driver circuit substrate 2 in the fourth embodiment (see FIG. 22) in that a transparent substrate 21c of a transparent insulator, such as glass, is provided in place of the substrate 21. In addition, a transparent insulating layer 25c is provided in place of the insulating layer 25. Further, a transparent conductive surface electrode 84 of ITO (Indium Tin Oxide) is provided in place of the surface electrode 24. Furthermore, a phtodetecting substrate 81 having a photodetecting element 83, such as a pin photodiode or avalanche photodiode, is provided on the bottom side of the transparent substrate 21c of the driver circuit substrate 2c (that side where the element switch sections 22 are not arranged). The photodetecting element 83 is located directly under the mirror body 82 and has a light receiving surface whose area is about the same as that of the mirror body 82. The other structure of the functional device according to the embodiment is the same as that of the functional device according to the fourth embodiment (see FIG. 22).

The operation of the functional device according to the embodiment will be discussed below. The voltage that has been generated in the element switch section 22 is applied to the transparent conductive surface electrode 84 via the conductor 25b in the contact hole 25a. Electrostatic force is generated between the transparent conductive surface electrode 84 and the mirror body 82 to thereby control the direction of the mirror body 82. That is, the transparent conductive surface electrodes 84 in the embodiment serve as the drive electrodes 24 in the fourth embodiment. Part of the light incident to the mirror body 82 is reflected and the remaining part is transmitted. The transmitted light passes through the transparent conductive surface electrode 84, the transparent insulating layer 25c and the base substrate 21b and reaches the light receiving surface of the photodetecting element 83. The other operations of the functional device according to the embodiment are the same as the corresponding operation of the functional device according to the first embodiment.

Because the transparent conductive surface electrode 84 in the fifth embodiment serves as the drive electrode that generates electrostatic force with respect to the mirror body 82, the embodiment can guarantee the same operation as that of the fourth embodiment. As the mirror body 82 is semitransparent, the drive electrode is the transparent electrode 84 and the base substrate 21b of a transparent insulator, such as glass, is used, part of input light is input to the photodetecting element 83 provided on the photodetecting substrate 81. As a result, part of the input light can be input to the photodetecting element 83 while directing the input light to a predetermined direction by driving the mirror body 82.

Accordingly, the embodiment has such an advantage as to be able to always monitor the intensity of an optical signal during communication by means of the photodetecting element 83 in addition to the advantages of the fourth embodiment. It is therefore possible to detect an abnormality in the optical signal that passes through the optical switch and a trouble, such as disconnection of the communication path. This can ensure reliable securing of the optical path in the communication and improvements on the quality and reliability of the communication network.

Figure 24:
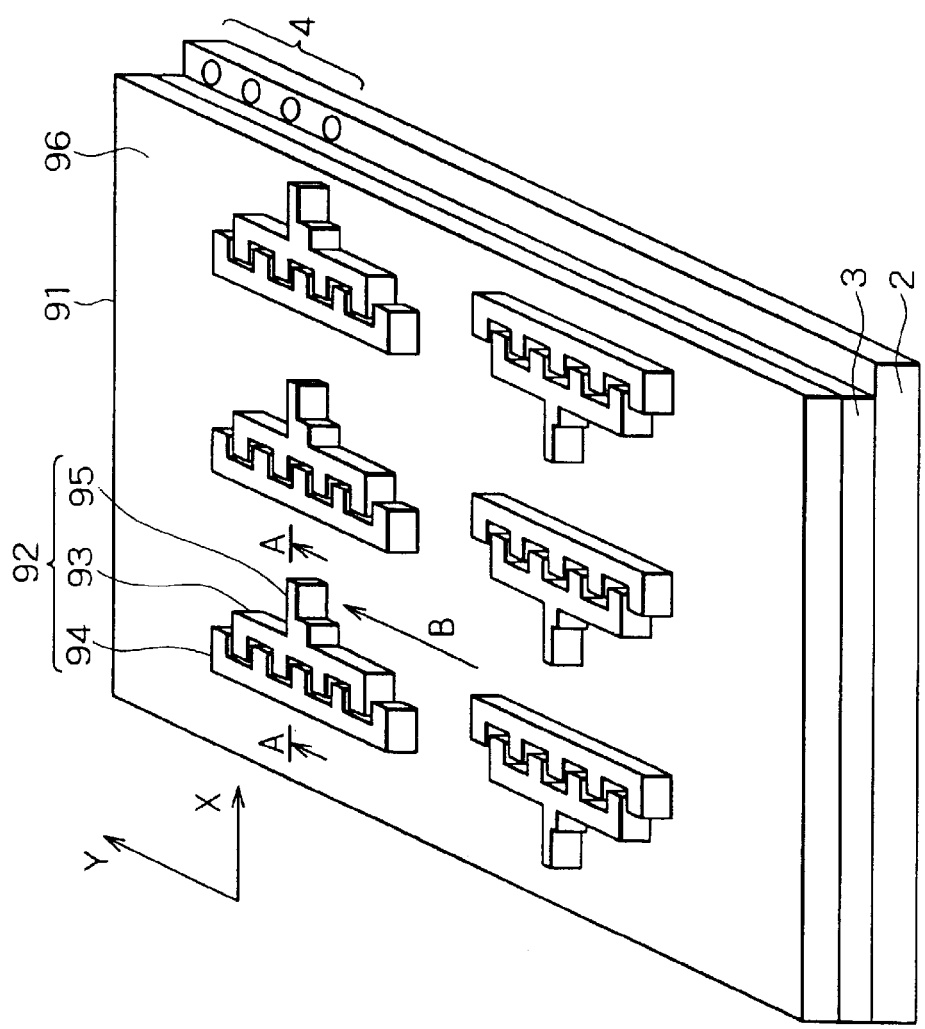
FIG. 24 is a perspective view depicting the structure of a functional device according to a sixth embodiment of the invention.
Figure 25:
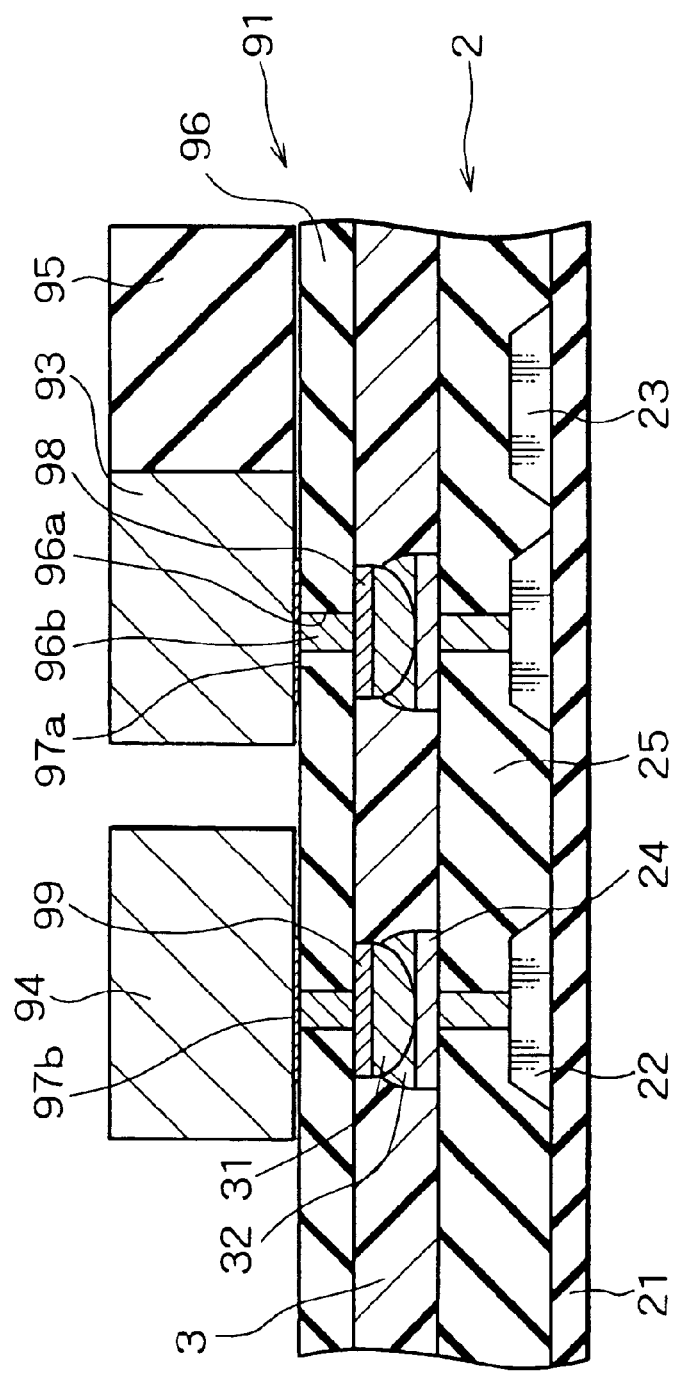
FIG. 25 is a cross-sectional view along the A—A line in FIG. 24.

The sixth embodiment of the invention will be discussed below. FIG. 24 is a perspective view depicting the structure of a functional device according to the embodiment. FIG. 25 is a cross-sectional view along the A—A line in FIG. 24. The functional device according to the embodiment uses a variable wavelength filter and uses electrostatic force as the drive force to drive the variable wavelength filter.

As shown in FIG. 24, the functional device according to the embodiment has a filter substrate 91 laminated on the driver circuit substrate 2. The filter substrate 91 is provided with a base substrate 96 on which at least one variable wavelength filter element section, e.g., six variable wavelength filter element sections 92 are laid out in an array. The variable wavelength filter element sections 92 are prepared by etching a silicon substrate or three-dimensionally processing a deposited polysilicon thin film by the silicon semiconductor processing technology. Each variable wavelength filter element section 92 comprises a filter element 95, a movable driver 93 for supporting the filter element 95 and a stator 94. Filters available as the filter element 95 include a filter which uses a dielectric multilayer whose thickness continuously varies and a Fabry-Perot filter which changes the gap between opposite reflecting surfaces. FIG. 24 shows the case where a filter using a dielectric multilayer is provided.

In case of using a dielectric multilayer as the filter element 95, the direction of the motion of the driver 93 is perpendicular to the direction in which the input light is input. In case where input light B is input in the Y direction in FIG. 24, for example, the direction of the motion of the driver 93 is the X direction. In case of using a Fabry-Perot filter (not shown) which changes the gap between opposite reflecting surfaces, the direction of the motion of the driver 93 is parallel to the incident direction of the input light and is the Y direction in FIG. 24, for example, when the input light B is input in the Y direction.

The driver 93 and the stator 94 both have electrodes with comb-teeth shapes and are so arranged as to be nested with each other. The driver 93 is supported by a leaf spring (not shown) fixed to the base substrate 96 of the filter substrate 91 and is separated from the base substrate 96. The shapes of the driver 93 and the stator 94 are not limited to the comb-teeth shapes shown in FIG. 24 but can take various shapes as long as the driver 93 is driven in a predetermined direction, such as the direction perpendicular to the incident direction of light in case of the dielectric multilayer filter or the direction parallel to the incident direction of light in case of the Fabry-Perot filter.

As shown in FIG. 25, drive electrodes 97a to be connected to the drivers 93 and drive electrodes 97b to be connected to the stators 94 are provided on the surface of the base substrate 96 (that side where the variable wavelength filter element section 92 is arranged). Through holes 96a are formed in the base substrate 96 below the drive electrodes 97a and 97b. Driver electrodes 98 and stator electrodes 99 are provided under the through holes 96a at the back surface of the base substrate 96 (that side where the variable wavelength filter element section 92 is not arranged). Connecting projections 31 are provided on the surfaces of the driver electrodes 98 and the stator electrodes 99. The driver electrodes 98 and the stator electrodes 99 are respectively connected to the drivers 93 and the stators 94 by associated conductive members 96b buried in the through holes 96a. Each driver electrode 98 is connected to the associated driver 93 via a leaf spring (not shown). Although the foregoing description of the embodiment has been given of the case where the structure of the driver circuit substrate 2 in the embodiment in FIG. 25 is the same as the structure of the driver circuit substrate 2 in the first embodiment, the driver circuit substrate 2 may be identical to the driver circuit substrate 2a in the second embodiment or the driver circuit substrate 2b in the third embodiment.

The filter substrate 91 is laminated on the driver circuit substrate 2 via the resin layer 3. More specifically, the surface electrodes 24 connected to the electrodes of the element switch sections 22 provided on the surface of the driver circuit substrate 2 are electrically connected to the associated driver electrodes 98 and stator electrodes 99 provided on the bottom side of the filter substrate 91.

The connecting projections (bumps) 31 respectively abut on the surface electrodes 24 and the connection members 32 of a solder or a conductive adhesive are provided in such a way as to cover the connecting projections 31 and the surface electrodes 24. The associated connecting projection 31 and surface electrode 24 are connected together by pressure bonding or the like and are covered around with the associated connection member 32 for reinforcement. The resin layer 3 of a thermosetting adhesive or the like is filled around the driver electrodes 98, the stator electrodes 99, the connecting projections 31, the surface electrodes 24 and the connection members 32 between the base substrate 96 and the insulator layer 25 to seal them.

Although the illustrated embodiment has the connecting projections 31 provided on the top surfaces of the respective driver electrodes 98 and stator electrodes 99 and abutting on the respective surface electrodes 24, the connecting projections 31 may be provided on the respective surface electrodes 24 in such a way as to abut on the respective driver electrodes 98 and stator electrodes 99. In this case, the connection members 32 are formed in such a way as to cover the connecting projections 31, the driver electrodes 98 and the stator electrodes 99.

Although the illustrated embodiment has the driver electrodes 98 and stator electrodes 99 arranged directly below the respective drivers 93 and stators 94 and connected to the respective surface electrodes 24 at those locations, the driver electrodes 98 and stator electrodes 99 and the surface electrodes 24 can be arranged at arbitrary positions on the bottom side of the base substrate 96 and the top surface of the insulator layer 25 as long as the electrical connection between the driver electrodes 98 and stator electrodes 99 and the surface electrodes 24 is secured.

The operation of the functional device according to the embodiment will be discussed. Through an operation similar to the operation of the first embodiment, a predetermined element switch section 22 is selected and applies a voltage to the surface electrode 24 via the contact hole 25a. Although the first embodiment requires four element switch sections 22 to drive a single mirror element 11 (see FIG. 2), the sixth embodiment needs a minimum of two element switch section 22 to drive a single variable wavelength filter element section 92.

To drive a predetermined variable wavelength filter element section 92, the gate of the element switch section 22 corresponding to this variable wavelength filter element section 92 is enabled (turned on) to apply the voltage from the applied voltage generating section 63 (see FIG. 6) to the stator electrode 99 and the driver electrode 98 as per the first embodiment. The voltage that is applied to the driver electrode 98 is applied to the driver 93 via the conductive members 96b and the drive electrode 97a. The voltage that is applied to the stator electrode 99 is applied to the stator 94 via the conductive members 96b and the drive electrode 97b. As the driver 93 and the stator 94 having electrodes with comb-teeth shapes are so arranged as to be nested with each other, electrostatic force is generated between the driver 93 and the stator 94. This causes the driver 93 to move in the X direction in accordance with the voltage applied between the stator electrode 99 and the driver electrode 98.

Therefore, the filter element 95 coupled to the driver 93 moves according to the movement of the driver 93. As a result, the filter element 95 is intervened in the path of the input light B. As the filter element 95 is formed by a dielectric multilayer, the wavelength of that component of the input light B input in the Y direction which can pass through the filter element 95 is limited to a specific wavelength. Because the filter element 95 has such a shape as to have a gradient thickness in the X direction, the movement of the filter element 95 in the X direction changes the wavelength of the light that can pass the filter element 95. This makes it possible to provide a filter capable of selectively passing a component of the input light B which has an arbitrary wavelength. Further, providing a plurality of variable wavelength filter element sections 92 in an optical device can provide an optical device which has a multi-channel filter.

Although the foregoing description of the embodiment has been given of the case where a voltage is applied to each of the stator 94 and driver 93, driving the driver 93 requires only a potential difference applied between the stator 94 and driver 93. Even if the stator 94 is grounded and a predetermined voltage is applied to the driver 93, therefore, it is possible to carry out an operation equivalent to the operation in the case where voltages are applied to both the stator 94 and the driver 93. In this case, the switch section 22 to be connected to the stator 94 can be omitted, thus further simplifying the structure of the functional device.

According to the embodiment as adapted to a functional device equipped with a multi-channel filter, it is possible to reduce the interconnections for supplying drive and control signals to the variable wavelength filter element section 92 as much as possible. This can ensure the miniaturization and higher reliability of the optical device. It is also possible to drive all the variable wavelength filter element sections without providing the same number of the driver circuit sections as the variable wavelength filter element sections, but with a single driver circuit section. Even if the variable wavelength filter element sections take a multi-channel design, therefore, the circuit section does not become larger, thus making it possible to suppress the enlargement of the functional device. Further, as the driver circuit is prepared by forming a plurality of TFTs on the substrate, the functional device can be prepared at a low cost. Furthermore, because the functional device is constructed by preparing the filter functional element and the driver circuit substrate in separate processes and laminating them one on the other, it is possible to optimize the processes of preparing the filter functional element and the driver circuit substrate and the characteristics thereof.

Figure 26:
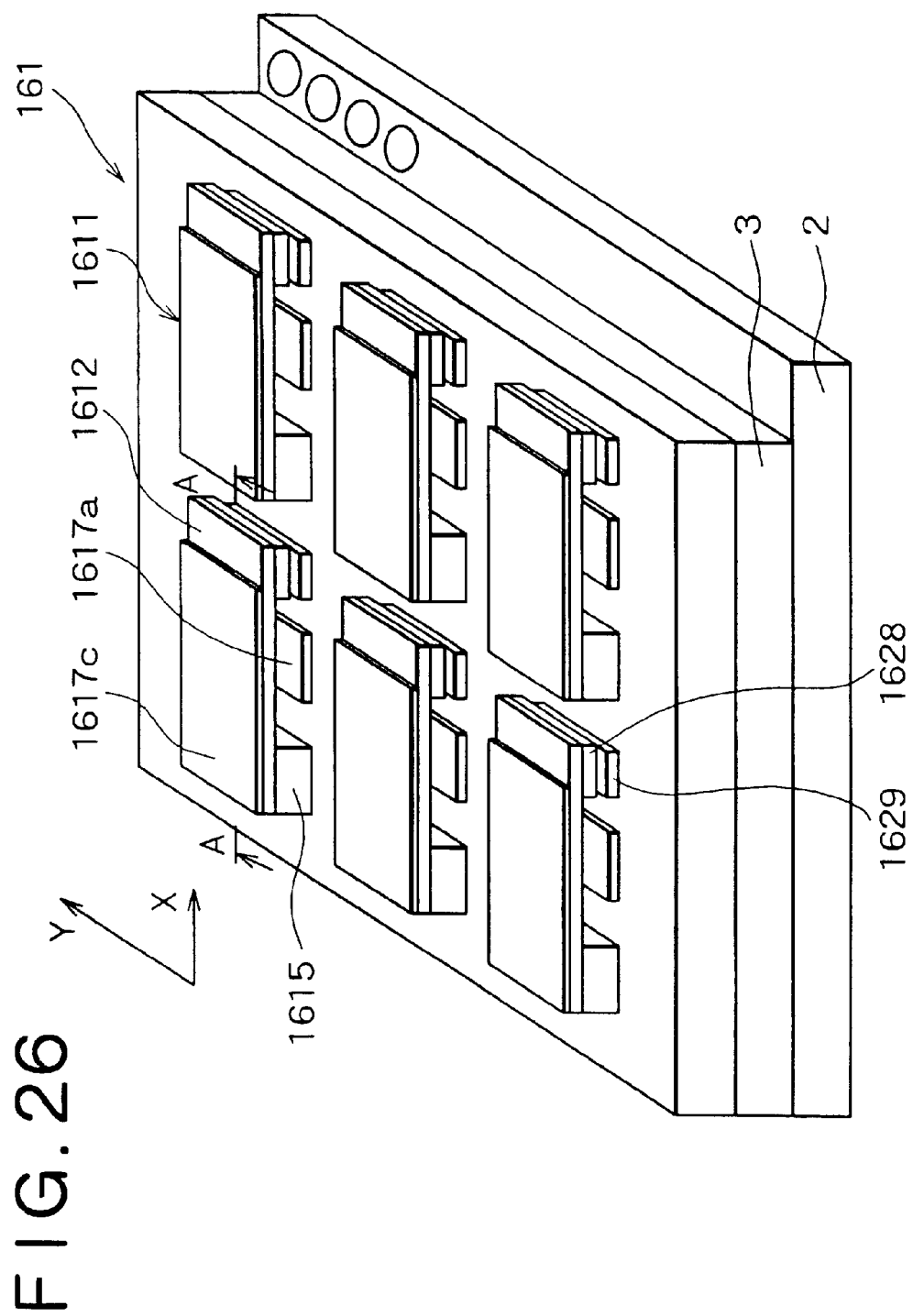
FIG. 26 is a perspective view showing the structure of a functional device according to a seventh embodiment of the invention.
Figure 27:
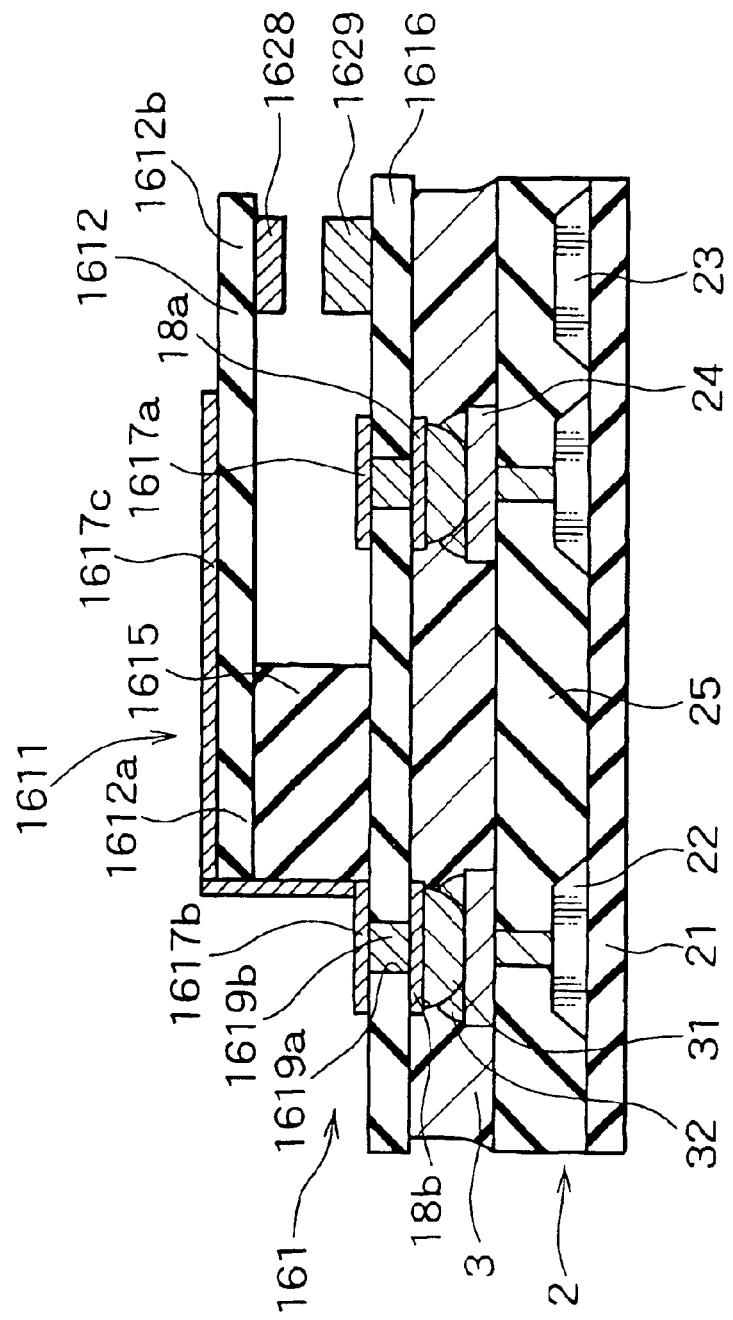
FIG. 27 is a cross-sectional view along the A—A line in FIG. 26.

The seventh embodiment of the invention will be discussed below. FIG. 26 is a perspective view showing the structure of a functional device according to the embodiment, and FIG. 27 is a cross-sectional view along the A—A line in FIG. 26. The functional device according to the embodiment uses an RF microelectromechanical switch and uses electrostatic force as the drive force to drive the switch.

As shown in FIGS. 26 and 27, the functional device according to the embodiment has a switch substrate 161 laminated on the driver circuit substrate 2. A base substrate 1616 is provided on the switch substrate 161 on which at least one switch element section, e.g., six switch element sections 1611 are laid out in an array. The switch element sections 1611 are prepared by etching a silicon substrate or three-dimensionally processing a deposited polysilicon thin film by the silicon semiconductor processing technology.

In the switch element section 1611, a supporting block 1615 is provided on the base substrate 1616 and a flexible cantilever beam 1612 is provided on the supporting block 1615. The cantilever beam 1612 has a parallelepiped shape whose lengthwise direction extends in parallel to the surface of the base substrate 1616. One end portion 1612a of the cantilever beam 1612 is supported on the supporting block 1615 while the other end portion 1612b is not supported. An electrical contact 1628 is provided on the bottom surface of the end portion 1612b, so that the cantilever beam 1612 supports the electrical contact 1628. An electrical contact 1629 is provided on the base substrate 1616. The electrical contact 1629 is arranged at the position at which it contacts the electrical contact 1628 when the cantilever beam 1612 is deformed to displace the end portion 1612b downward and the position of the electrical contact 1628 falls. Further, the contact 1629 forms an RF input port to which an RF input signal is input, while the contact 1628 forms an RF output port.

As shown in FIG. 27, drive electrodes 1617a and 1617b are provided on the base substrate 1616. A drive electrode 1617c is provided on the cantilever beam 1612 and is connected to the drive electrode 1617b on the base substrate 1616. Accordingly, the drive electrode 1617a and the drive electrode 1617c are arranged at a predetermined interval therebetween by the cantilever beam 1612 and the supporting block 1615. The through holes 19a are formed in the base substrate 1616 under the drive electrodes 1617a and 1617b. The drive electrodes 1617a and 1617b are connected to the connecting electrodes 18 via the through holes 19a, thereby forming through electrodes. The conductor 19b of a solder, tin (Sn) or the like may be buried in the through hole 19a. Further, the connecting projections (bumps) 31 of Au (gold) or a solder are provided on the surfaces of the connecting electrodes 18.

The structures of the driver circuit substrate 2 and the resin layer 3 are the same as those of the first embodiment. Specifically, the switch substrate 161 is laminated on the driver circuit substrate 2 via the resin layer 3. More specifically, the surface electrodes 24 connected to the electrodes of the element switch sections 22 provided on the surface of the driver circuit substrate 2 are electrically connected to the associated connecting electrodes 18 provided on the bottom side of the switch substrate 161. The connecting projections (bumps) 31 respectively abut on the surface electrodes 24 and the connection members 32 of a solder or a conductive adhesive are provided in such a way as to cover the connecting projections 31 and the surface electrodes 24. The associated connecting projection 31 and surface electrode 24 are connected together by pressure bonding or the like and are covered around with the associated connection member 32 for reinforcement. The resin layer 3 of a thermosetting adhesive or the like is filled around the connecting electrodes 18, the connecting projections 31, the surface electrodes 24 and the connection members 32 between the base substrate 1616 and the insulator layer 25 to seal them.

Although the illustrated embodiment has the connecting projections 31 provided on the top surfaces of the respective connecting electrodes 18 and abutting on the respective surface electrodes 24, the connecting projections 31 may be provided on the respective surface electrodes 24 in abutment with the respective connecting electrodes 18. In this case, the connection members 32 are formed in such a way as to cover the connecting projections 31 and the connecting electrodes 18.

Although the above-described embodiment has the connecting electrodes 18 provided directly below the drive electrodes 1617a and 1617b and connected to the respective surface electrodes 24 at those positions, the connecting electrodes 18 and the surface electrodes 24 can be arranged at arbitrary positions of the bottom side of the base substrate 1616 and the surface of the insulator layer 25 as long as the electrical connection between both electrodes is secured.

Although the foregoing description of the embodiment has been given of the case where the structure of the driver circuit substrate 2 in the embodiment is identical to the structure of the driver circuit substrate 2 in the first embodiment, the driver circuit substrate 2 may be identical to the driver circuit substrate 2a in the second embodiment or the driver circuit substrate 2b in the third embodiment.

The operation of the functional device according to the embodiment will be discussed. Through an operation similar to the operation of the first embodiment, a predetermined element switch section 22 is selected and applies a voltage to the surface electrode 24 via the contact hole 25a. Although the first embodiment requires four element switch sections 22 to drive a single mirror element 11 (see FIG. 2), the seventh embodiment needs a minimum of two element switch section 22 to drive a single switch element section 1611.

The gate of a selected element switch section 22 is enabled (turned on) to apply the voltage from the applied voltage generating section 63 (see FIG. 6) to connecting electrodes 18a and 18b. The voltage that is applied to the connecting electrode 18a is applied to the drive electrode 1617a. The voltage that is applied to the connecting electrode 18b is applied to the drive electrode 1617c via the drive electrode 1617b. This generates electrostatic force between the drive electrode 1617a and the drive electrode 1617c, thus deforming the cantilever beam 1612 whose end portion 1612b is displaced downward. As a result, the electrical contact 1628 contacts the electrical contact 1629 so that the RF input signal is output to the RF output port. When the application of the voltage to the drive electrodes 1617a and 1617c is stopped, the cantilever beam 1612 returns to the stationary position shown in FIG. 27 due to the restoring force of the cantilever beam 1612 itself.

Two electrical contacts 1629 separated from each other may be provided on the base substrate 1616 to be respectively an RF input terminal and RF output terminal, so that when those two electrical contacts come in contact with the electrical contact 1628, the RF input terminal is connected to the RF output terminal.

This embodiment can realize an RF switch which selectively enables or disables the outputting of the RF input signal to the output port. Further, providing the functional device with a plurality of switch element sections 1611 can yield a functional device with a multi-channel switch.

Although the foregoing description of the embodiment has been given of the case where a voltage is applied to each of the drive electrode 1617a and the drive electrode 1617c, driving the switch element section 1611 requires only a potential difference applied between the drive electrodes 1617a and 1617c. Therefore, the drive electrode 1617c may be grounded and a predetermined voltage may be applied to the drive electrode 617a, or the ground potential may be applied to the drive electrode 1617a and a predetermined voltage may be applied to the drive electrode 617c. In this case, it is also possible to carry out an operation equivalent to the operation in the case where voltages are applied to both drive electrodes. In that case, the switch section 22 to be connected to the drive electrode 1617c can be omitted, thus further simplifying the structure of the functional device.

According to the embodiment as adapted to a functional device equipped with a multi-channel switch, it is possible to reduce the interconnections for supplying drive and control signals to the switch element section as much as possible. This can ensure the miniaturization and higher reliability of the optical device. It is also possible to drive all the switch element sections without providing the same number of the driver circuit sections as the switch element sections, but with a single driver circuit section. Even if the switch element sections take a multi-channel design, therefore, the circuit section does not become larger, thus making it possible to suppress the enlargement of the functional device. Further, as the driver circuit is prepared by forming a plurality of TFTs on the substrate, the functional device can be prepared at a low cost. Furthermore, because the functional device is constructed by preparing the switch functional element and the driver circuit substrate in separate processes and laminating them one on the other, it is possible to optimize the processes of preparing the switch functional element and the driver circuit substrate and the characteristics thereof.

What is claimed is:

1. A method of manufacturing for a functional device comprising the steps of:

forming a processing element and a microelectromechanical section for supporting said processing element said processing element in a movable manner on a silicon substrate;

forming a through hole in an insulating substrate;

forming a first electrode on a first side of said insulating substrate and a second electrode on a second side of said insulating substrate, said second electrode being connected to said first electrode via said through hole;

preparing a functional-element movably supporting structure by joining said processing element and said microelectromechanical section to said insulating substrate;

preparing a driver circuit substrate by forming on a substrate a driver circuit which drives a functional-element; and joining said functional-element movably supporting structure to said driver circuit substrate in such a way that said driver circuit is connected to said second electrode.

2. The method of manufacturing according to claim 1, wherein joining of said functional-element movably supporting structure to said driver circuit substrate is carried out via a joining layer which has an insulating layer, formed of an insulating material, for joining said functional-element to said driver circuit substrate and connection terminals, provided in said insulating layer for connecting said functional-element to said driver circuit.

* * * * *